(12) United States Patent
Mayumi

(10) Patent No.: US 11,874,997 B2
(45) Date of Patent: Jan. 16, 2024

(54) DISPLAY DEVICE EQUIPPED WITH TOUCH PANEL AND CONTROL METHOD THEREFOR

(71) Applicant: Sharp Kabushiki Kaisha, Sakai (JP)

(72) Inventor: Masashi Mayumi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/031,099

(22) PCT Filed: Nov. 27, 2020

(86) PCT No.: PCT/JP2020/044204
§ 371 (c)(1),
(2) Date: Apr. 10, 2023

(87) PCT Pub. No.: WO2022/113265
PCT Pub. Date: Jun. 2, 2022

(65) Prior Publication Data
US 2023/0376148 A1   Nov. 23, 2023

(51) Int. Cl.
*G09G 5/00*   (2006.01)
*G06F 3/041*   (2006.01)
(Continued)

(52) U.S. Cl.
CPC ......... *G06F 3/04184* (2019.05); *G09G 3/006* (2013.01); *G09G 3/3233* (2013.01); *G09G 2310/08* (2013.01); *G09G 2320/045* (2013.01); *G09G 2354/00* (2013.01); *H10K 59/40* (2023.02)

(58) Field of Classification Search
CPC . G06F 3/04184; G06F 3/04186; G09G 3/006; G09G 3/3233; G09G 2310/08; G09G 2320/045; G09G 2354/00; H10K 59/40
See application file for complete search history.

(56) References Cited

U.S. PATENT DOCUMENTS 9,430,968 B2 *   8/2016   Kishi ................... G09G 3/3233
9,697,769 B2 *   7/2017   Kishi ..................... G09G 3/006
(Continued)

FOREIGN PATENT DOCUMENTS

WO   2015/093100 A1   6/2015

*Primary Examiner* — Joe H Cheng
(74) *Attorney, Agent, or Firm* — Keating & Bennett, LLP

(57) ABSTRACT

A display device including a touch panel implements touch detection with sufficient accuracy without reducing the accuracy of a compensation process that uses an external compensation scheme. A plurality of sensor electrodes for touch detection are divided into a plurality of blocks such that each block corresponds to pixel circuits in a plurality of consecutive rows and pixel circuits in a plurality of consecutive columns. A cathode electrode is divided so as to correspond to the plurality of blocks, and each of the divided cathode electrodes is shared by a corresponding plurality of organic EL elements. A touch panel controller applies a touch driving signal to sensor electrodes belonging to a block different from a block corresponding to pixel circuits that are targets for a characteristic detection process, during a current measurement period included in a period during which the characteristic detection process is performed.

12 Claims, 26 Drawing Sheets

(51) Int. Cl.
*G09G 3/00* (2006.01)
*G09G 3/3233* (2016.01)
*H10K 59/40* (2023.01)

(56) References Cited

U.S. PATENT DOCUMENTS

| | | | | |
|---|---|---|---|---|
| 9,711,092 B2* | 7/2017 | Kishi | ................... | G09G 3/3291 |
| 9,837,016 B2* | 12/2017 | Kishi | ................... | G09G 3/3233 |
| 9,842,545 B2* | 12/2017 | Kishi | ..................... | G09G 3/325 |
| 10,621,913 B2* | 4/2020 | Furukawa | ................ | G09G 3/30 |
| 11,462,144 B2* | 10/2022 | Furukawa | ............ | G09G 3/3283 |
| 11,733,803 B2* | 8/2023 | Mayumi | ................ | G09G 3/035 |
| | | | | 345/174 |
| 2010/0225634 A1* | 9/2010 | Levey | ................. | G09G 3/3208 |
| | | | | 345/212 |
| 2015/0356899 A1* | 12/2015 | Yamanaka | ........... | G09G 3/3258 |
| | | | | 345/77 |
| 2017/0053587 A1* | 2/2017 | Kim | ..................... | G09G 3/2092 |
| 2017/0108970 A1 | 4/2017 | Kim et al. | | |
| 2017/0162101 A1 | 6/2017 | Ohara et al. | | |
| 2022/0335866 A1* | 10/2022 | Lee | ..................... | G09G 3/3233 |

* cited by examiner

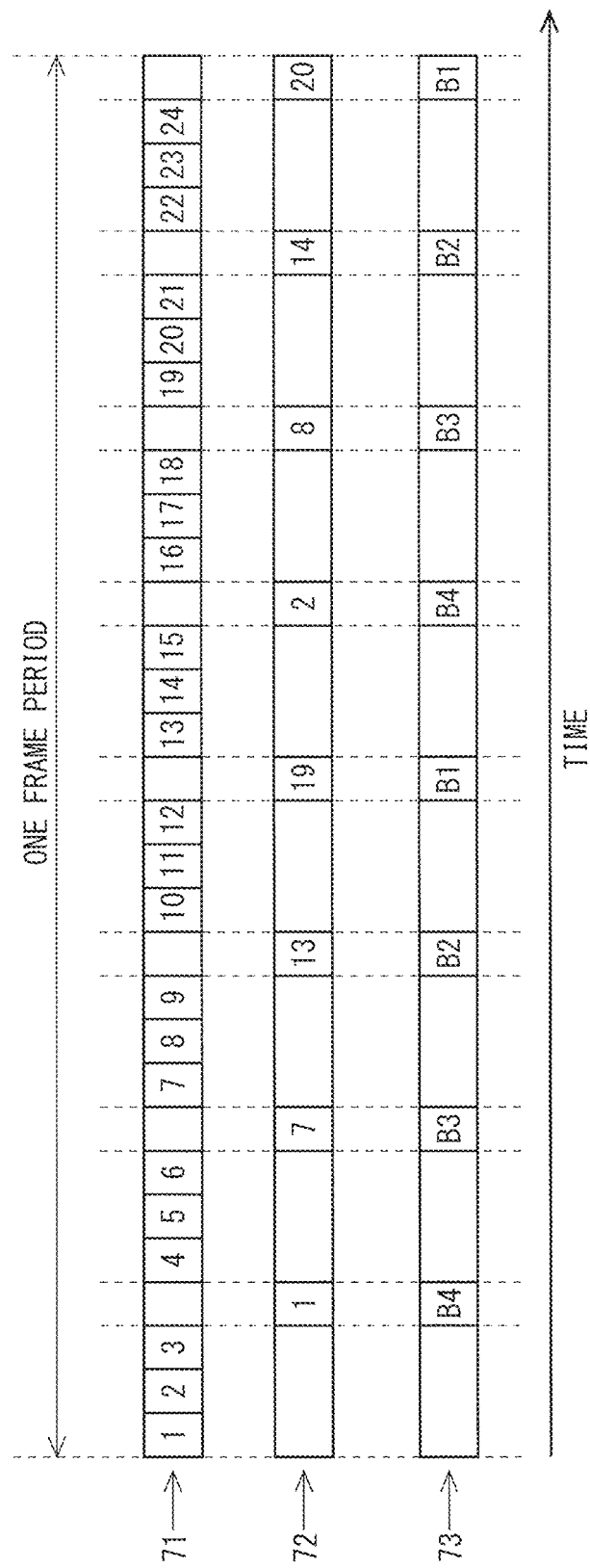

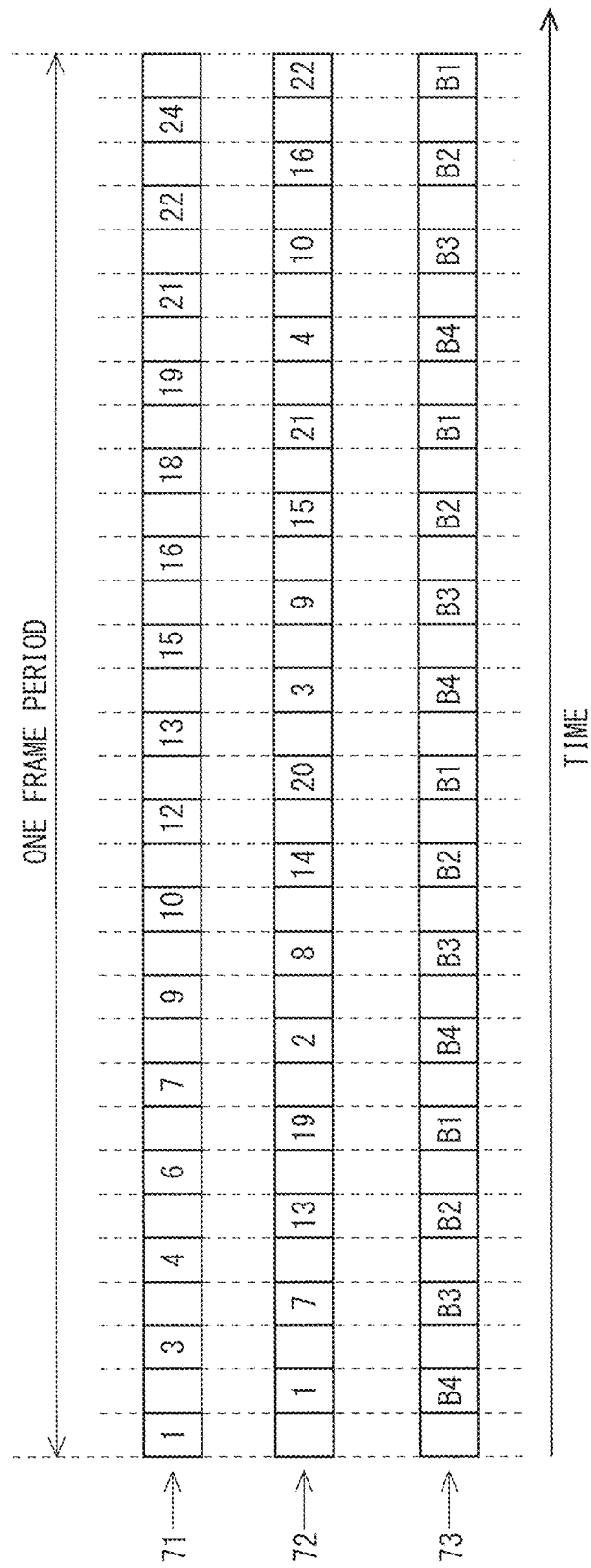

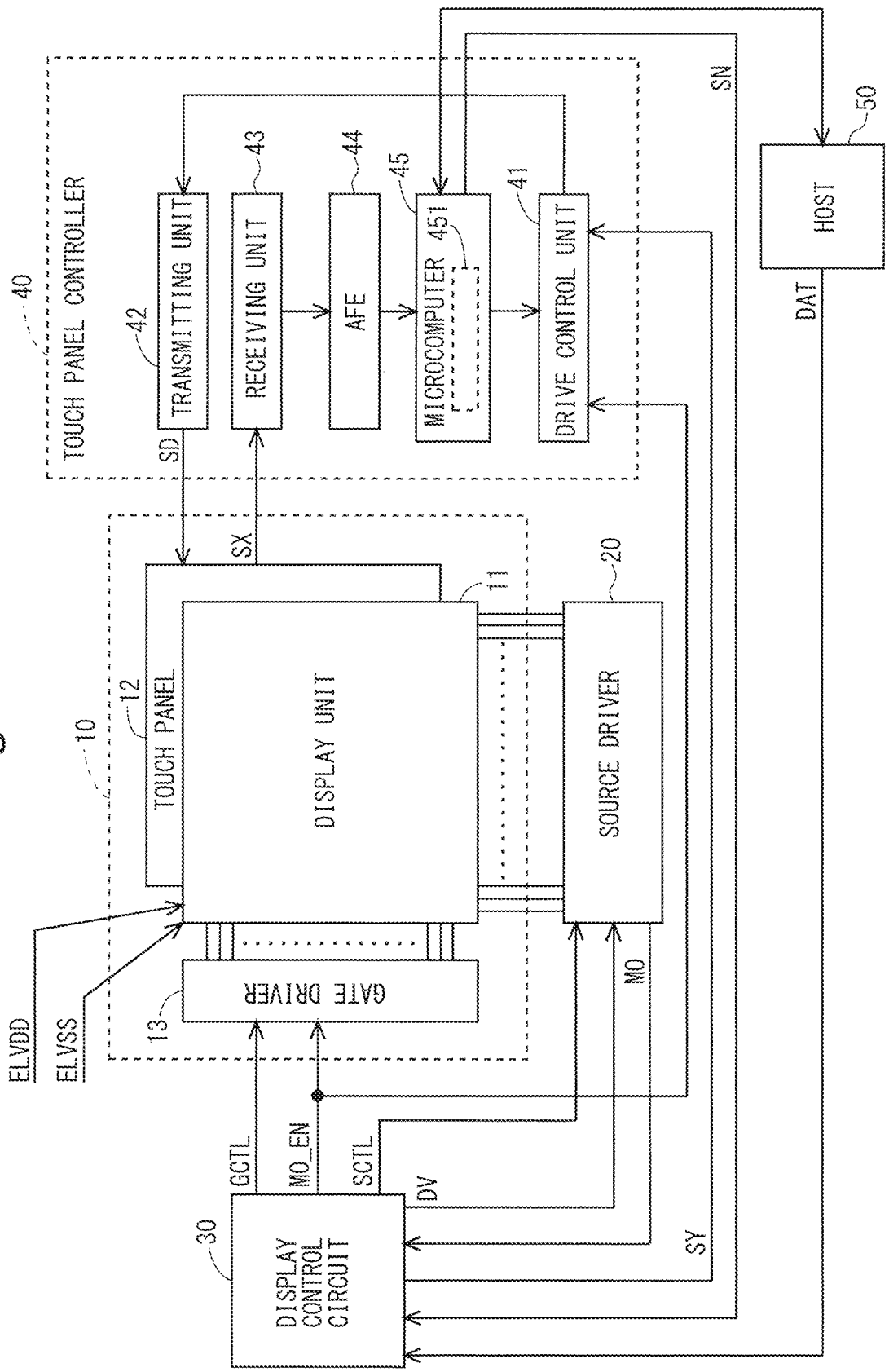

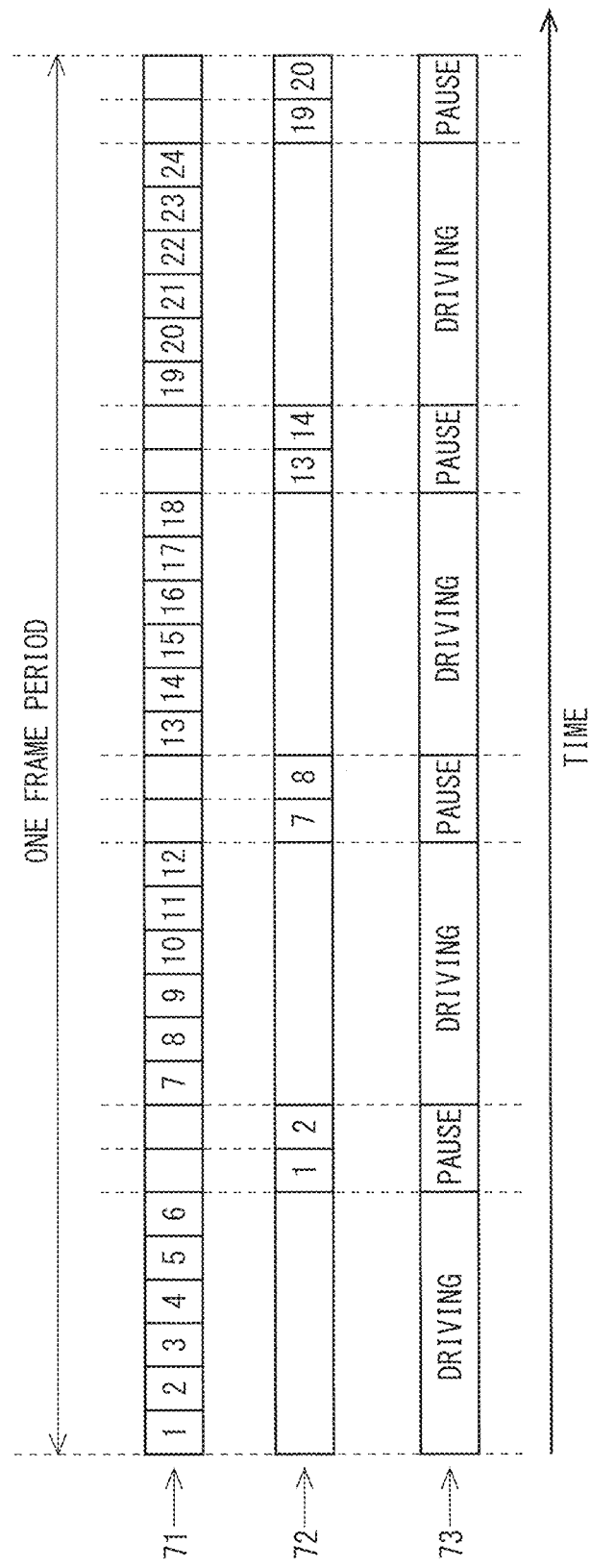

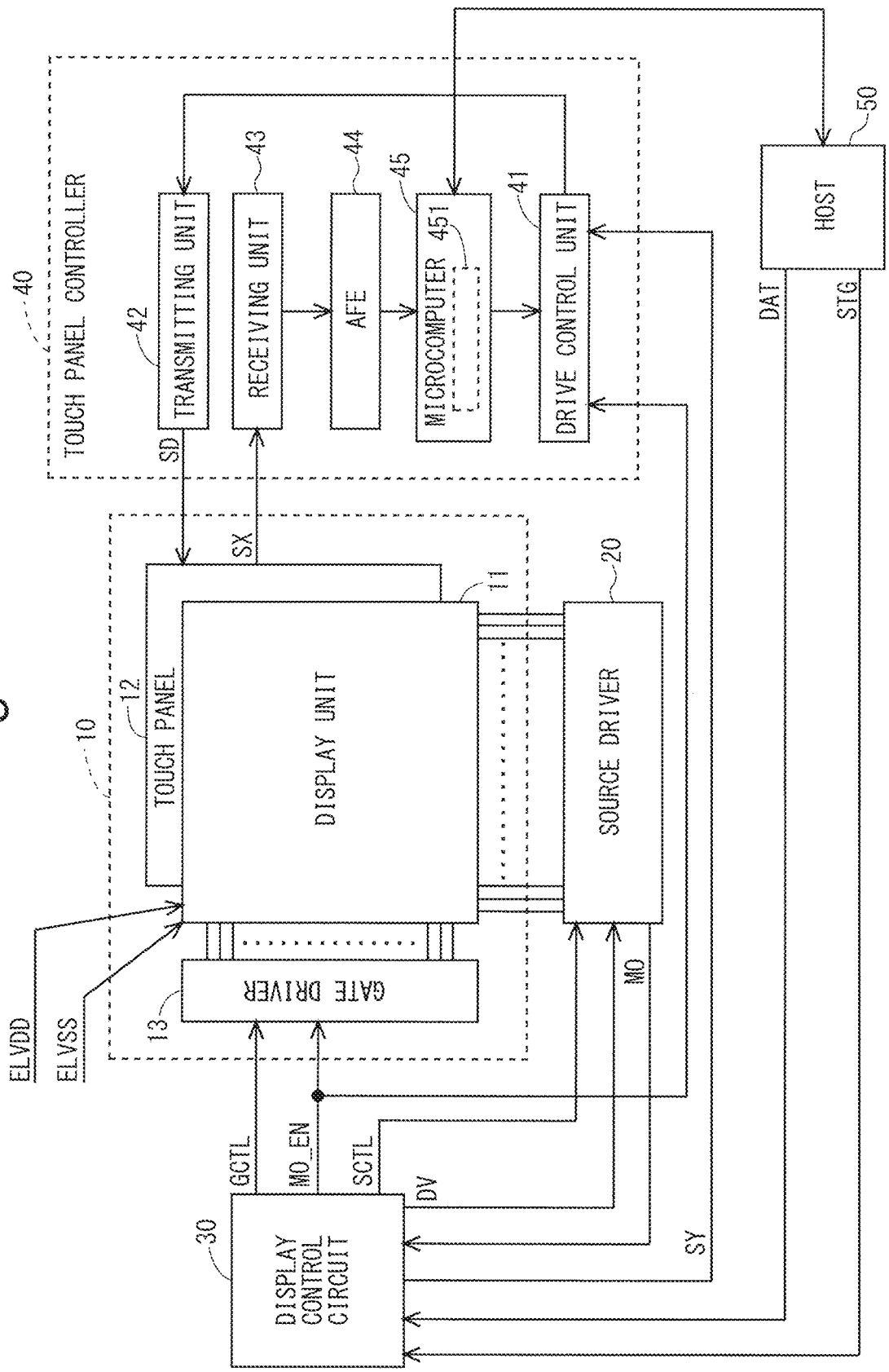

DISPLAY DEVICE EQUIPPED WITH TOUCH PANEL AND CONTROL METHOD THEREFOR

This application is a national stage filed under 35 USC 371 of PCT/JP2020/044204, filed on Nov. 27, 2020, the disclosure of which is hereby incorporated by reference in their entirety.

TECHNICAL FIELD

The following disclosure relates to a display device (e.g., an organic EL display device) that includes a touch panel and adopts an external compensation scheme as a scheme for a compensation process, and a control method for the display device.

BACKGROUND ART

In recent years, there has been a remarkable spread of an organic EL display device including pixel circuits each including an organic EL element. The organic EL element is also called an organic light-emitting diode (OLED), and is a self-emissive display element that emits light at luminance determined based on a current flowing therethrough. As such, since the organic EL element is a self-emissive display element, the organic EL display device can easily achieve slimming down, compared to a liquid crystal display device that requires a backlight, a color filter, and the like.

Meanwhile, as drive systems for the organic EL display device, there are known a passive matrix system (also called a simple matrix system) and an active matrix system. An organic EL display device that adopts the passive matrix system is simple in structure, but has difficulty in increasing size and increasing definition. On the other hand, an organic EL display device that adopts the active matrix system (hereinafter, referred to as "active matrix-type organic EL display device") can easily achieve an increase in size and an increase in definition compared to the organic EL display device that adopts the passive matrix system.

In the active matrix-type organic EL display device, a plurality of pixel circuits are formed in matrix form. Each pixel circuit includes a drive transistor that controls supply of a current to an organic EL element. As the drive transistor, typically, a thin-film transistor (TFT) is adopted. However, a threshold voltage of the thin-film transistor changes by degradation. Multiple drive transistors are provided in a display unit of the organic EL display device and the level of degradation differs between the drive transistors, and thus, variations occur in the threshold voltage. As a result, variations in luminance occur, degrading display quality. In addition, the current efficiency of the organic EL element decreases over time. That is, even if a constant current is supplied to the organic EL element, luminance gradually decreases over time. As a result, burn-in occurs. For those reasons, the active matrix-type organic EL display device performs a process of compensating for degradation of the drive transistors or degradation of the organic EL elements.

As one scheme for a compensation process, an external compensation scheme is known. According to the external compensation scheme, a current flowing through a drive transistor or an organic EL element under a predetermined condition is measured by a circuit provided external to a pixel circuit. Then, based on a result of the measurement, an input image signal is corrected. By this, degradation of the drive transistor or degradation of the organic EL element is compensated for.

In this specification, a series of processes for measuring, outside a pixel circuit, a current flowing through the pixel circuit to compensate for degradation of a drive transistor or an organic EL element (display element) are referred to as "characteristic detection process", a period during which the characteristic detection process is performed is referred to as "characteristic detection period", and a period during which a current is actually measured in the characteristic detection period is referred to as "current measurement period". In addition, a characteristic of the drive transistor provided in the pixel circuit is referred to as "TFT characteristic", and a characteristic of the organic EL element provided in the pixel circuit is referred to as "OLED characteristic".

WO 2015/093100 pamphlet describes a scheme called "real-time monitoring" which is one of external compensation schemes. The real-time monitoring is a scheme in which a characteristic detection process is performed during a normal display period. More specifically, in the real-time monitoring, in each frame period during operation of an organic EL display device, a characteristic detection process is performed during a period between a period (scanning period) during which data signals are written to pixel circuits in a given row and a period (scanning period) during which data signals are written to pixel circuits in another row. According to such real-time monitoring, a characteristic detection process is performed at a high frequency, and thus, degradation of drive transistors or degradation of organic EL elements is effectively compensated for.

Note that in relation to this application, U.S. Patent Application Publication No. 2017/0108970 describes that in a display device configured to share a common electrode for display and a touch electrode for touch position detection, for example, driving of pixel circuits and driving of a touch panel are performed in a time-division manner, and a display area and the touch panel each are divided.

PRIOR ART DOCUMENTS

Patent Documents

[Patent Document 1] WO 2015/093100 pamphlet
[Patent Document 2] U.S. Patent Application Publication No. 2017/0108970

SUMMARY

Problems to be Solved by the Invention

Meanwhile, in recent years, an organic EL display device including a touch panel has begun to be spread. Examples of the organic EL display device including a touch panel include smartphones and tablet terminals. In a case in which the organic EL display device including a touch panel adopts an external compensation scheme as a scheme for a compensation process, when driving noise of the touch panel has occurred during performance of a characteristic detection process, currents may not be properly measured due to the driving noise. Hence, there is a concern that input image signals may not be appropriately corrected, degrading display quality. In addition, it is also conceivable that driving noise of components for image display propagates through the touch panel. In this case, the accuracy of detection of a touch position decreases.

Note that in U.S. Patent Application Publication No. 2017/0108970, a compensation process is not considered at all, and a technique described in U.S. Patent Application Publication No. 2017/0108970 is a technique applied to a display device (typically, a liquid crystal display device)

configured to share a common electrode for display and a touch electrode for touch position detection.

An object of the following disclosure is therefore to implement touch detection with sufficient accuracy without reducing the accuracy of a compensation process that uses an external compensation scheme in a display device including a touch panel.

Means for Solving the Problems

A display device according to some embodiments of the present disclosure is a display device including: a display unit including pixel circuits of n rows×m columns (n and m are integers greater than or equal to 2), each having a display element provided between a first electrode and a second electrode and configured to emit light at luminance determined based on a drive current flowing through the second electrode from the first electrode, and a drive transistor configured to control the drive current; and a touch panel including a plurality of sensor electrodes for detecting a touch position on the display unit, the display device further including:
- a display drive circuit configured to drive the pixel circuits of n rows×m columns while performing a characteristic detection process to compensate for degradation of the drive transistor or the display element, the characteristic detection process including a process of measuring a current flowing through each pixel circuit; and
- a touch panel control circuit configured to apply a touch driving signal for detecting a touch position to the plurality of sensor electrodes and to detect a touch position based on detection signals obtained from the plurality of sensor electrodes,
wherein the plurality of sensor electrodes are divided into a plurality of blocks such that each block corresponds to pixel circuits in a plurality of consecutive rows and pixel circuits in a plurality of consecutive columns,
the second electrode is divided so as to correspond to the plurality of blocks, and each of divided second electrodes is shared by a corresponding plurality of display elements, and
the touch panel control circuit applies the touch driving signal to sensor electrodes belonging to a block different from a block corresponding to pixel circuits that are targets for the characteristic detection process, during a current measurement period during which a process of measuring a current is performed, the process being included in the characteristic detection process.

A display device according to some other embodiments of the present disclosure is a display device including: a display unit including pixel circuits of n rows×m columns (n and m are integers greater than or equal to 2), each having a display element provided between a first electrode and a second electrode and configured to emit light at luminance determined based on a drive current flowing through the second electrode from the first electrode, and a drive transistor configured to control the drive current; and a touch panel including a plurality of sensor electrodes for detecting a touch position on the display unit, the display device further including:
- a display drive circuit configured to drive the pixel circuits of n rows×m columns while performing a characteristic detection process to compensate for degradation of the drive transistor or the display element, the characteristic detection process including a process of measuring a current flowing through each pixel circuit;
- a touch panel control circuit configured to apply a touch driving signal for detecting a touch position to the plurality of sensor electrodes and to detect a touch position based on detection signals obtained from the plurality of sensor electrodes; and
- a display driving noise extracting unit configured to extract, from the detection signals, display driving noise caused by driving of the pixel circuits of n rows×m columns,
wherein the plurality of sensor electrodes are divided into a plurality of blocks such that each block corresponds to pixel circuits in a plurality of consecutive rows and pixel circuits in a plurality of consecutive columns,
the second electrode is divided so as to correspond to the plurality of blocks, and each of divided second electrodes is shared by a corresponding plurality of display elements,
when magnitude of the display driving noise is greater than a predetermined threshold level, the touch panel control circuit applies the touch driving signal to sensor electrodes belonging to a block different from a block corresponding to pixel circuits that are targets for the characteristic detection process, during a current measurement period during which a process of measuring a current is performed, the process being included in the characteristic detection process, and
when the magnitude of the display driving noise is smaller than the predetermined threshold level, the touch panel control circuit applies the touch driving signal to each sensor electrode during a period during which an image writing process for writing a data signal to each pixel circuit is performed, the data signal being based on an image to be displayed on the display unit.

A control method (for a display device) according to some embodiments of the present disclosure is a control method for a display device including: a display unit including pixel circuits of n rows×m columns (n and m are integers greater than or equal to 2), each having a display element provided between a first electrode and a second electrode and configured to emit light at luminance determined based on a drive current flowing through the second electrode from the first electrode, and a drive transistor configured to control the drive current; and a touch panel including a plurality of sensor electrodes for detecting a touch position on the display unit, wherein
the display device includes:
  the display unit;
  a display drive circuit configured to drive the pixel circuits of n rows×m columns while performing a characteristic detection process to compensate for degradation of the drive transistor or the display element, the characteristic detection process including a process of measuring a current flowing through each pixel circuit; and
  a touch panel control circuit configured to apply a touch driving signal for detecting a touch position to the plurality of sensor electrodes and to detect a touch position based on detection signals obtained from the plurality of sensor electrodes,
the plurality of sensor electrodes are divided into a plurality of blocks such that each block corresponds to pixel circuits in a plurality of consecutive rows and pixel circuits in a plurality of consecutive columns, the second electrode is divided so as to correspond to the plurality of blocks, and each of divided second electrodes is shared by a corresponding plurality of display elements, the control method includes:
- an image writing step of allowing the display drive circuit to operate so that a data signal based on an image to be displayed on the display unit is written to each pixel circuit;
- a characteristic detecting step of allowing the display drive circuit to operate so that the characteristic detection process is performed; and
- a touch position detecting step of allowing the touch panel control circuit to operate so that detection of a touch position is performed, the detection of a touch position in the touch position detecting step is performed during a period during which currents are measured in the characteristic detecting step, and in the touch position detecting step, the touch driving signal is applied to sensor electrodes belonging to a block different from a block corresponding to pixel circuits that are targets for the characteristic detection process.

A control method (for a display device) according to some other embodiments of the present disclosure is a control method for a display device including: a display unit including pixel circuits of n rows×m columns (n and m are integers greater than or equal to 2), each having a display element provided between a first electrode and a second electrode and configured to emit light at luminance determined based on a drive current flowing through the second electrode from the first electrode, and a drive transistor configured to control the drive current; and a touch panel including a plurality of sensor electrodes for detecting a touch position on the display unit, wherein the display device includes:
- the display unit;
- a display drive circuit configured to drive the pixel circuits of n rows×m columns while performing a characteristic detection process to compensate for degradation of the drive transistor or the display element, the characteristic detection process including a process of measuring a current flowing through each pixel circuit; and
- a touch panel control circuit configured to apply a touch driving signal for detecting a touch position to the plurality of sensor electrodes and to detect a touch position based on detection signals obtained from the plurality of sensor electrodes, the plurality of sensor electrodes are divided into a plurality of blocks such that each block corresponds to pixel circuits in a plurality of consecutive rows and pixel circuits in a plurality of consecutive columns, the second electrode is divided so as to correspond to the plurality of blocks, and each of divided second electrodes is shared by a corresponding plurality of display elements, the control method includes:
- a display driving noise extracting step of extracting, from the detection signals, display driving noise caused by driving of the pixel circuits of n rows×m columns; and
- an amount-of-noise determining step of determining whether magnitude of the display driving noise is greater than a predetermined threshold level, when it is determined in the amount-of-noise determining step that the magnitude of the display driving noise is greater than the predetermined threshold level, the touch panel control circuit applies the touch driving signal to sensor electrodes belonging to a block different from a block corresponding to pixel circuits that are targets for the characteristic detection process, during a current measurement period during which a process of measuring a current is performed, the process being included in the characteristic detection process, and when it is determined in the amount-of-noise determining step that the magnitude of the display driving noise is smaller than the predetermined threshold level, the touch panel control circuit applies the touch driving signal to each sensor electrode during a period during which an image writing process for writing a data signal to each pixel circuit is performed, the data signal being based on an image to be displayed on the display unit.

Effects of the Invention

According to several embodiments of the present disclosure, a plurality of sensor electrodes for touch detection are divided into a plurality of blocks, and as a second electrode (typically, a cathode electrode) for display elements, a second electrode that is divided so as to correspond to the plurality of blocks is used. Under such a configuration, application of a touch driving signal to sensor electrodes is performed in a block different from a block corresponding to pixel circuits that are targets for a characteristic detection process, during a current measurement period during which a process of measuring currents included in the characteristic detection process is performed. Hence, abnormalities in the characteristic detection process caused by driving noise of the touch panel do not occur, and a compensation process for compensating for degradation of drive transistors or display elements can be accurately performed. In addition, by performing application of a touch driving signal to the sensor electrodes in the above-described manner, the touch panel is not influenced by noise caused by driving of the pixel circuits, and touch detection is also accurately performed. As such, the display device including a touch panel implements touch detection with sufficient accuracy without reducing the accuracy of a compensation process that uses an external compensation scheme.

According to several other embodiments of the present disclosure, application of a touch driving signal to the sensor electrodes is performed at timing that differs between when display driving noise is greater than a threshold level and when the display driving noise is smaller than the threshold level. Regarding this, when the display driving noise is greater than the threshold level, application of a touch driving signal to the sensor electrodes is performed during a period during which a characteristic detection process is performed, whereas when the display driving noise is smaller than the threshold level, application of a touch driving signal to the sensor electrodes is performed during a period during which an image writing process is performed. That is, when the display driving noise is smaller than the threshold level, application of a touch driving signal to the sensor electrodes and an image writing process are performed in the same period. Hence, a sufficient period that can be used for an image writing process can be secured. As a result, both high-resolution display and fast touch detection are implemented.

BRIEF DESCRIPTION OF THE DRAWINGS

FIG. 25 is a diagram for describing a relationship between an image writing process, a characteristic detection process, and a touch driving process in a third embodiment.

FIG. 26 is a diagram for describing a relationship between an image writing process, a characteristic detection process, and a touch driving process in the third embodiment.

FIG. 27 is a block diagram showing an overall configuration of an active matrix-type organic EL display device according to the third embodiment.

FIG. 28 is a diagram for describing a relationship between an image writing process, a characteristic detection process, and a touch driving process in the third embodiment.

FIG. 29 is a block diagram showing an overall configuration of an active matrix-type organic EL display device according to a variant of the third embodiment.

MODES FOR CARRYING OUT THE INVENTION

Embodiments will be described below with reference to the accompanying drawings. Note that in the following, it is assumed that m and n are integers greater than or equal to 2, i is an integer between 1 and n, inclusive, and j is an integer between 1 and m, inclusive.

1. First Embodiment

<1.1 Overall Configuration and Summary of Operation>

Figure 2:
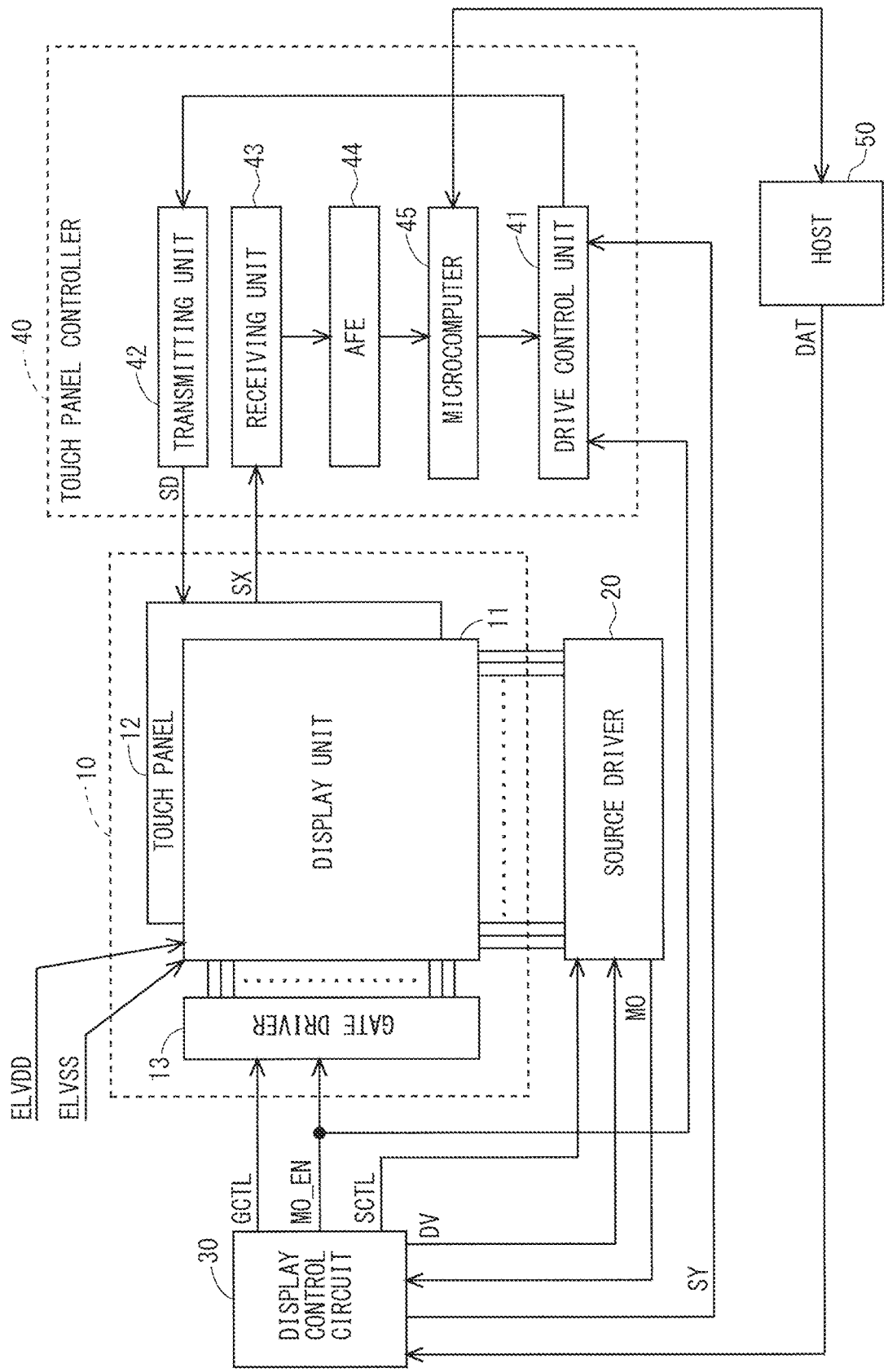
FIG. 2 is a block diagram showing an overall configuration of an active matrix-type organic EL display device according to the first embodiment.

FIG. 2 is a block diagram showing an overall configuration of an active matrix-type organic EL display device according to a first embodiment. The organic EL display device includes an organic EL panel 10, a source driver (data signal line drive circuit) 20, a display control circuit 30, a touch panel controller 40, and a host 50. The organic EL panel 10 includes a display unit 11, a touch panel 12, and a gate driver 13. The display unit 11 is a region in which components (various types of wiring, transistors, organic EL elements, etc.) for displaying an image are provided, and the display unit 11 and the touch panel 12 are integrally formed in the organic EL panel 10. In addition, the gate driver 13 is formed on a substrate constituting the organic EL panel 10. That is, the gate driver 13 is monolithically formed. Note, however, that a configuration in which the gate driver 13 is not monolithically formed can also be adopted. The touch panel controller 40 includes a drive control unit 41, a transmitting unit 42, a receiving unit 43, an analog front-end (AFE) 44, and a microcomputer 45. Note that the touch panel controller 40 also includes an oscillator, a memory, etc.

Figure 3:
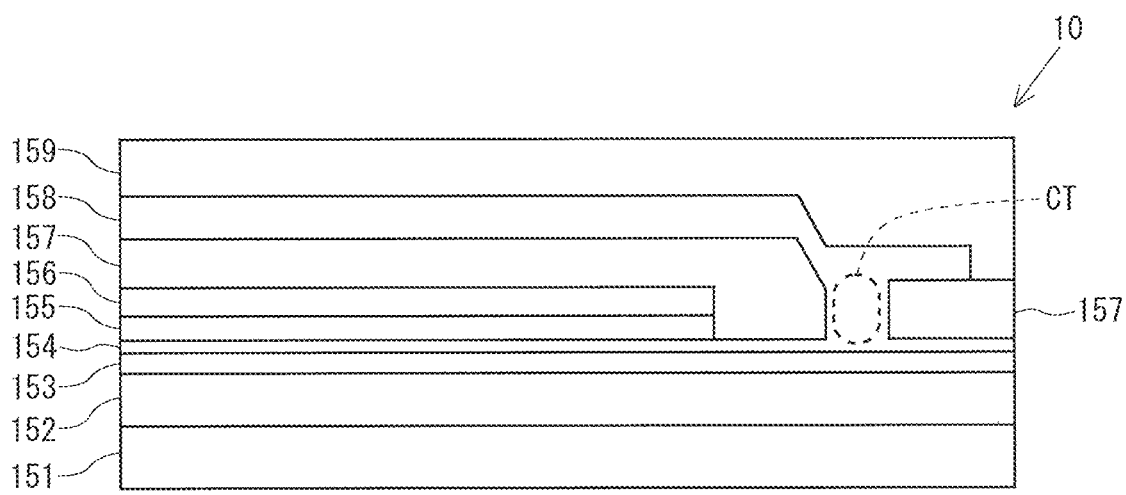
FIG. 3 is a partial cross-sectional view of an organic EL panel of the first embodiment.

FIG. 3 is a partial cross-sectional view of the organic EL panel 10. On a substrate 151 there is formed a polyimide layer 152, and on the polyimide layer 152 there is provided a display wiring layer 153 including anode electrodes of organic EL elements and various types of wiring that form pixel circuits. On the display wiring layer 153 there is provided touch detection wiring 154 that connects sensor electrodes constituting the touch panel 12 to the touch panel controller 40. On the touch detection wiring 154 there is provided an OLED layer 155 including an electron transport layer, a light-emitting layer, and a hole transport layer, and on the OLED layer 155 there is provided a cathode electrode 156. On the cathode electrode 156 there is formed a sealing layer 157. Note that as can be grasped from FIG. 3, in a partial region, a sealing layer 157 is formed on the touch detection wiring 154. On the sealing layers 157 there is provided a touch panel layer 158 including the sensor electrodes, and a protective layer 159 is formed so as to cover the touch panel layer 158. In a portion given reference character CT in FIG. 3 there is formed a contact hole that connects the sensor electrodes to the touch detection wiring 154.

Figure 4:
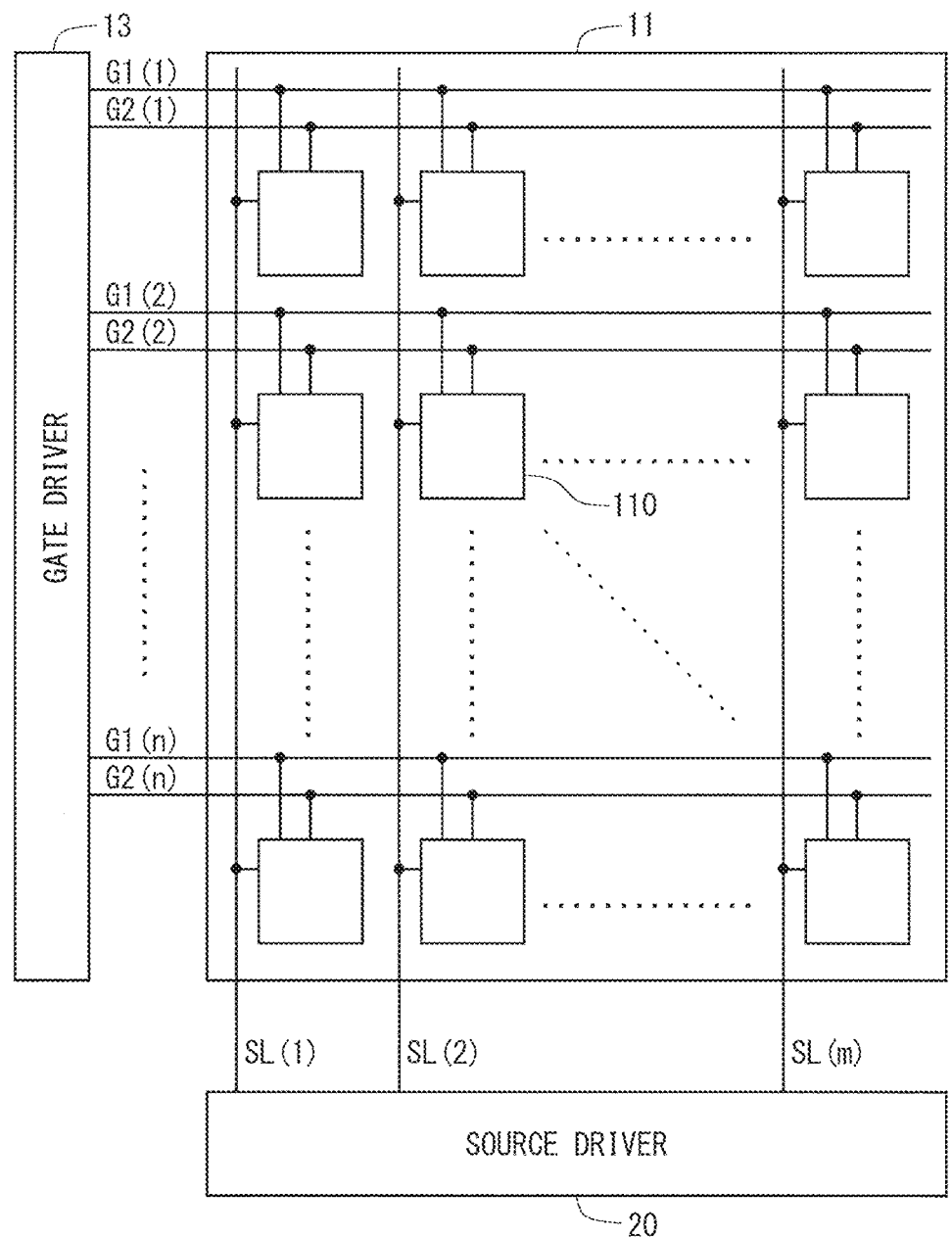
FIG. 4 is a diagram for describing a configuration of a display unit in the first embodiment.

As shown in FIG. 4, in the display unit 11 there are disposed m data signal lines SL(1) to SL(m) and n scanning signal lines G1(1) to G1(n) intersecting the m data signal lines SL(1) to SL(m). In addition, in the display unit 11 there are disposed n monitoring control lines G2(1) to G2(n) so as to have a one-to-one correspondence with the n scanning signal lines G1(1) to G1(n). The scanning signal lines G1(1) to G1(n) and the monitoring control lines G2(1) to G2(n) are parallel to each other. Furthermore, in the display unit 11 there are provided pixel circuits 110 of n rows×m columns at respective intersections of the n scanning signal lines G1(1) to G1(n) and the m data signal lines SL(1) to SL(m). In addition, in the display unit 11 there is disposed a high-level power line (not shown) that supplies a high-level power supply voltage ELVDD.

Note that in the following, when the m data signal lines SL(1) to SL(m) do not need to be distinguished from each other, the data signal line is simply given reference character SL. Likewise, when the n scanning signal lines G1(1) to G1(n) do not need to be distinguished from each other, the scanning signal line is simply given reference character G1, and when the n monitoring control lines G2(1) to G2(n) do not need to be distinguished from each other, the monitoring control line is simply given reference character G2.

The operation of each component shown in FIG. 2 will be described below. The display control circuit 30 receives image data DAT sent from the host 50 and monitoring data (data measured to determine TFT characteristics or OLED characteristics) MO sent from the source driver 20, and outputs digital video signals DV, gate control signals GCTL that control the operation of the gate driver 13, source control signals SCTL that control the operation of the source driver 20, and a monitoring enable signal MO_EN that controls a characteristic detection process. The gate control signals GCTL include a gate start pulse signal, a gate clock signal, etc. The source control signals SCTL include a source start pulse signal, a source clock signal, a latch strobe signal, etc. Note that the digital video signals DV for image display are generated by performing a compensation computation process on the image data DAT based on the monitoring data MO.

The gate driver 13 is connected to the scanning signal lines G1(1) to G1(n) and the monitoring control lines G2(1) to G2(n). The gate driver 13 applies scanning signals to the scanning signal lines G1(1) to G1(n) and applies monitoring control signals to the monitoring control lines G2(1) to G2(n), based on the gate control signals GCTL and monitoring enable signal MO_EN outputted from the display control circuit 30.

Figure 5:
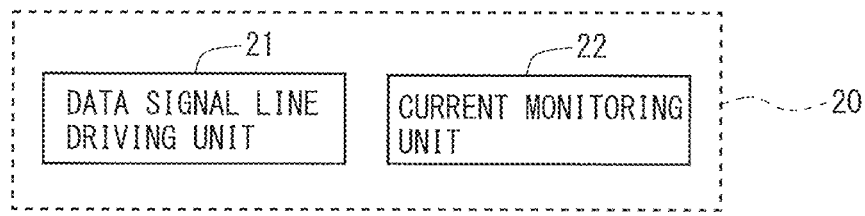
FIG. 5 is a diagram for describing functions of a source driver in the first embodiment.

The source driver 20 is connected to the data signal lines SL(1) to SL(m). The source driver 20 selectively performs the operation of driving the data signal lines SL(1) to SL(m) (the operation of applying data signals to the data signal lines SL(1) to SL(m)) and the operation of measuring currents flowing through the data signal lines SL(1) to SL(m). That is, as shown in FIG. 5, the source driver 20 functionally includes a portion that functions as a data signal line driving unit 21 that drives the data signal lines SL(1) to SL(m); and a portion that functions as a current monitoring unit 22 that measures currents flowing from the pixel circuits 110 to the data signal lines SL(1) to SL(m) and currents flowing from the data signal lines SL(1) to SL(m) to the pixel circuits 110. The current monitoring unit 22 measures currents flowing through the data signal lines SL(1) to SL(m), and outputs monitoring data MO generated based on measurement values. As such, the data signal lines SL(1) to SL(m) are not only used to transmit data signals for image display, but are also used as signal lines for allowing, upon a characteristic detection process, a current based on a characteristic of a drive transistor or an organic EL element to flow therethrough.

As above, by applying scanning signals to the scanning signal lines G1(1) to G1(n), applying monitoring control signals to the monitoring control lines G2(1) to G2(n), and applying data signals to the data signal lines SL(1) to SL(m), an image based on the image data DAT is displayed on the display unit 11. In addition, a characteristic detection process is performed and a compensation computation process is performed on the image data DAT based on the monitoring data MO, and thus, degradation of the drive transistors or the organic EL elements is compensated for.

Further, synchronizing signals (e.g., a horizontal synchronizing signal and a vertical synchronizing signal) SY and the monitoring enable signal MO_EN are sent to the touch panel controller 40 from the display control circuit 30. The drive control unit 41 in the touch panel controller 40 controls the operation of the transmitting unit 42 based on the synchronizing signals SY and the monitoring enable signal MO_EN. The transmitting unit 42 provides a driving signal SD for performing touch detection to the touch panel 12, based on the control by the drive control unit 41. In this manner, timing at which the driving signal SD is applied to each sensor electrode constituting the touch panel 12 is controlled. Note that the driving signal SD is, for example, high-frequency continuous pulses. The receiving unit 43 receives detection signals SX from the touch panel 12. The AFE 44 performs processes, such as noise removal and amplification, on the detection signals SX received by the receiving unit 43. The microcomputer 45 determines whether there is a touch and identifies a touch position, based on the detection signals SX having been subjected to the processes by the AFE 44. Information on the touch position is sent to the host 50 from the microcomputer 45, and the host 50 transmits image data DAT to the display control circuit 30, based on the touch position. In the above-described manner, an image is displayed on the display unit 11 based on the touch position.

Meanwhile, as described above, the touch panel controller 40 controls timing at which the driving signal SD is applied to each sensor electrode constituting the touch panel 12, based on the synchronizing signals SY and monitoring enable signal MO_EN sent from the display control circuit 30. By this, drive operation for image display and drive operation for touch detection are prevented from interfering with each other, a detailed description of which will be made later.

Note that, in the present embodiment, a display drive circuit is implemented by the gate driver 13 and the source driver 20, and a touch panel control circuit is implemented by the touch panel controller 40.

<1.2 Touch Panel and the Cathode Electrodes>

Figure 6:
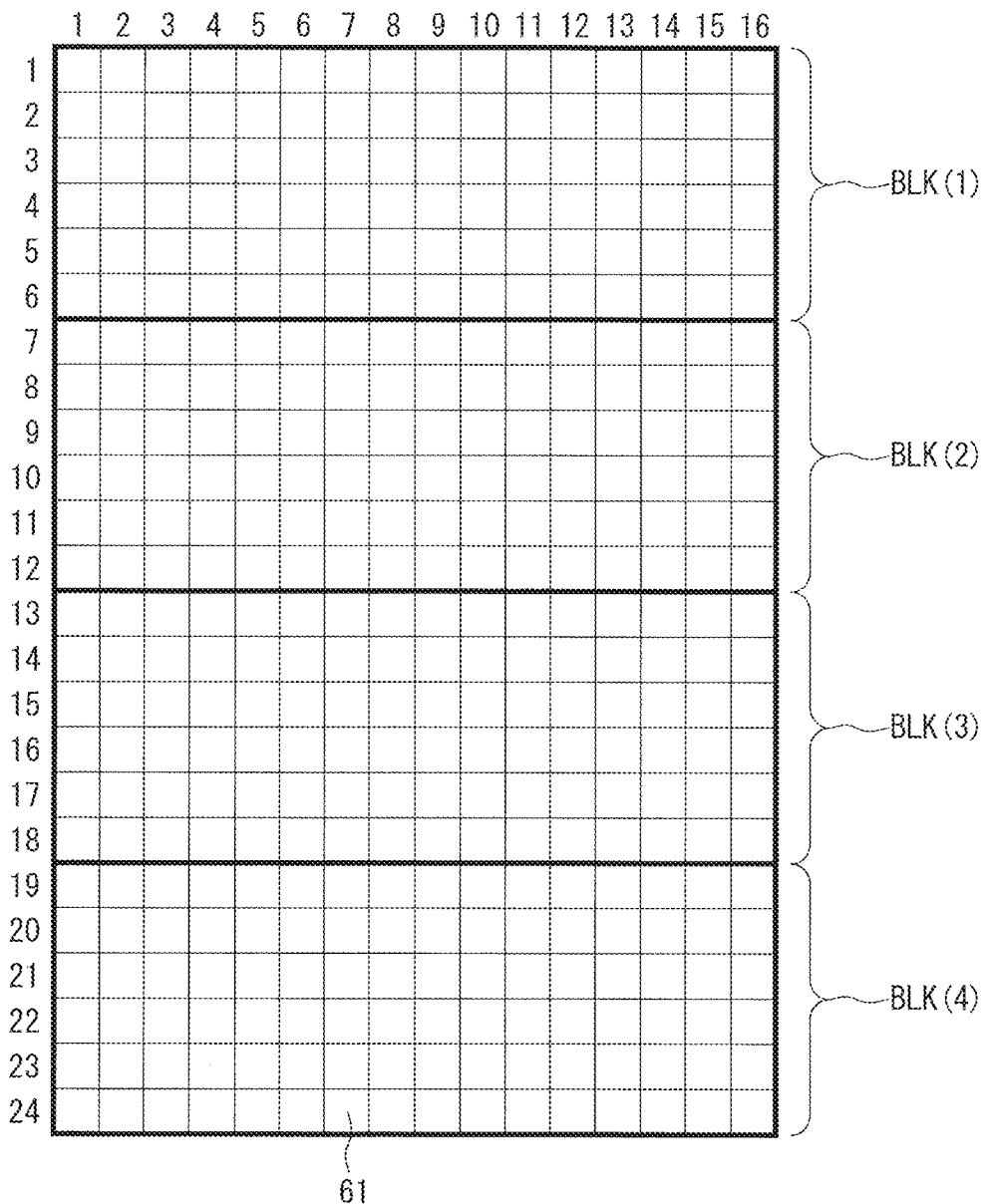
FIG. 6 is a diagram for describing a touch panel of the first embodiment.

FIG. 6 is a diagram for describing the touch panel 12 of the present embodiment. In the present embodiment, as shown in FIG. 6, the touch panel 12 includes sensor electrodes 61 arranged in a matrix of 24 rows×16 columns. The sensor electrodes 61 of 24 rows×16 columns are not electrically connected to each other. A driving signal SD is provided for each sensor electrode 61 from the touch panel controller 40. Note that the area of each sensor electrode 61 is larger than the area of each pixel. Thus, a region including sensor electrodes 61 for one row corresponds to a region including pixel circuits 110 for a plurality of rows, and a region including sensor electrodes 61 for one column corresponds to a region including pixel circuits 110 for a plurality of columns.

Further, in the present embodiment, the sensor electrodes 61 of 24 rows×16 columns are divided into four blocks (a first block BLK(1) to a fourth block BLK(4)). Each block BLK includes sensor electrodes 61 for six consecutive rows. In other words, each block BLK corresponds to a plurality of consecutive rows of pixel circuits 110. Note that in the following, to distinguish a row of sensor electrodes 61 from a row of pixel circuits 110, the row of pixel circuits 110 (a row including pixels arranged side by side in a direction in which the scanning signal lines G1 and the monitoring control lines G2 extend) may be referred to as "pixel row". Likewise, a column of pixel circuits 110 (a column including pixels arranged side by side in a direction in which the data signal lines SL extend) may be referred to as "pixel column".

Figure 7:
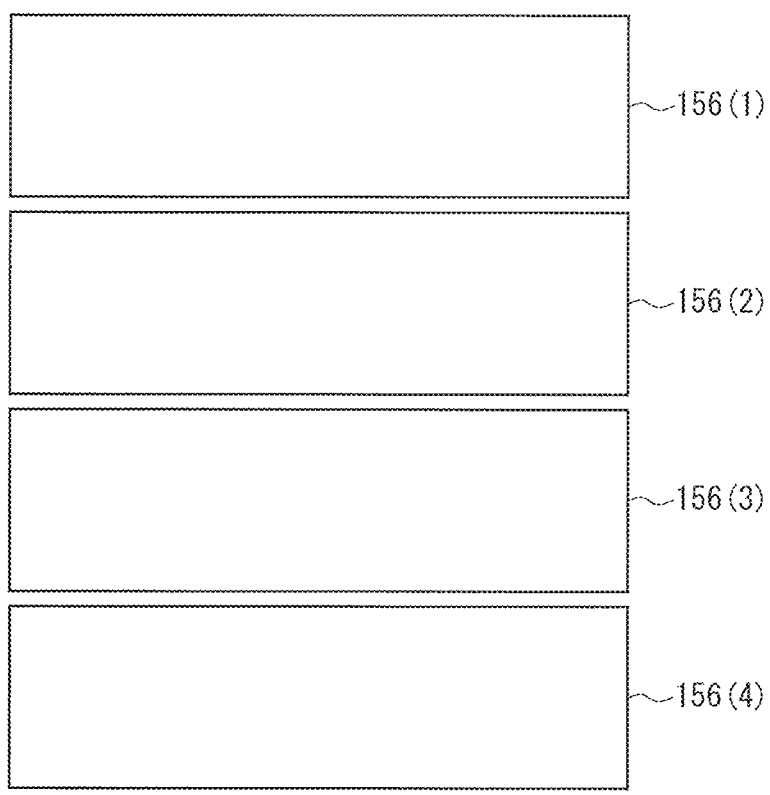
FIG. 7 is a diagram for describing cathode electrodes of the first embodiment.

FIG. 7 is a diagram for describing cathode electrodes of the present embodiment. The pixel circuits 110 of the organic EL display device each include an organic EL element. An anode electrode (first electrode) is provided at one end of the organic EL element, and a cathode electrode (second electrode) is provided at the other end of the organic EL element. Regarding this, although the anode electrode needs to be provided for each organic EL element, the cathode electrode can be shared by all organic EL elements. Therefore, in general, one electrode corresponding to the entire "display unit" region is adopted as a cathode electrode. On the other hand, in the present embodiment, as shown in FIG. 7, a cathode electrode is divided into four parts so as to correspond to the above-described four blocks (the first block BLK(1) to the fourth block BLK(4)). In FIG. 7, the four divided cathode electrodes are given reference characters 156(1) to 156(4).

Note that the configuration shown in FIG. 6 is an example and the configuration is not limited thereto. That is, there are no particular limitations on the number of the sensor electrodes 61 and the number of rows of sensor electrodes 61 constituting one block. Note also that although in the example shown in FIG. 6, each block includes sensor electrodes 61 for 16 columns, each block may include, for example, sensor electrodes 61 for four columns or sensor electrodes 61 for eight columns. Furthermore, the number of divisions of the cathode electrode 156 is not limited to four. The cathode electrode 156 is divided so as to correspond to the number of blocks. Moreover, for the configuration of the touch panel 12, for example, a configuration in which the touch panel 12 includes a plurality of transmitting-side electrodes and a plurality of receiving-side electrodes intersecting the transmitting-side electrodes or a configuration in which the touch panel 12 includes a plurality of X electrodes in which a plurality of rhombus patterns are connected in a vertical direction and a plurality of Y electrodes in which a plurality of rhombus patterns are connected in a horizontal direction (a configuration called a diamond pattern) can also be adopted.

<1.3 Pixel Circuits and the Source Driver>

Next, the pixel circuits 110 and the source driver 20 will be described in detail. The source driver 20 performs the following operation when functioning as the data signal line driving unit 21. The source driver 20 receives source control signals SCTL outputted from the display control circuit 30 and applies, as data signals, video signal voltages (voltages for image display) generated based on target luminance to the respective m data signal lines SL(1) to SL(m). During this time, the source driver 20 sequentially holds digital video signals DV indicating voltages to be applied to the respective data signal lines SL, at timing at which a pulse of a source clock signal is generated, triggered by a pulse of a source start pulse signal. Then, the held digital video signals DV each are converted into an analog voltage at timing at which a pulse of a latch strobe signal is generated. The converted analog voltages are simultaneously applied as data signals to all data signal lines SL(1) to SL(m). When the source driver 20 functions as the current monitoring unit 22, the source driver applies monitoring voltages (voltages for measuring currents) to the data signal lines SL(1) to SL(m), and thereby obtains, as analog data, currents flowing through the data signal lines SL(1) to SL(m), and converts the analog data into digital data. The converted digital data is outputted as monitoring data MO from the source driver 20.

Figure 8:
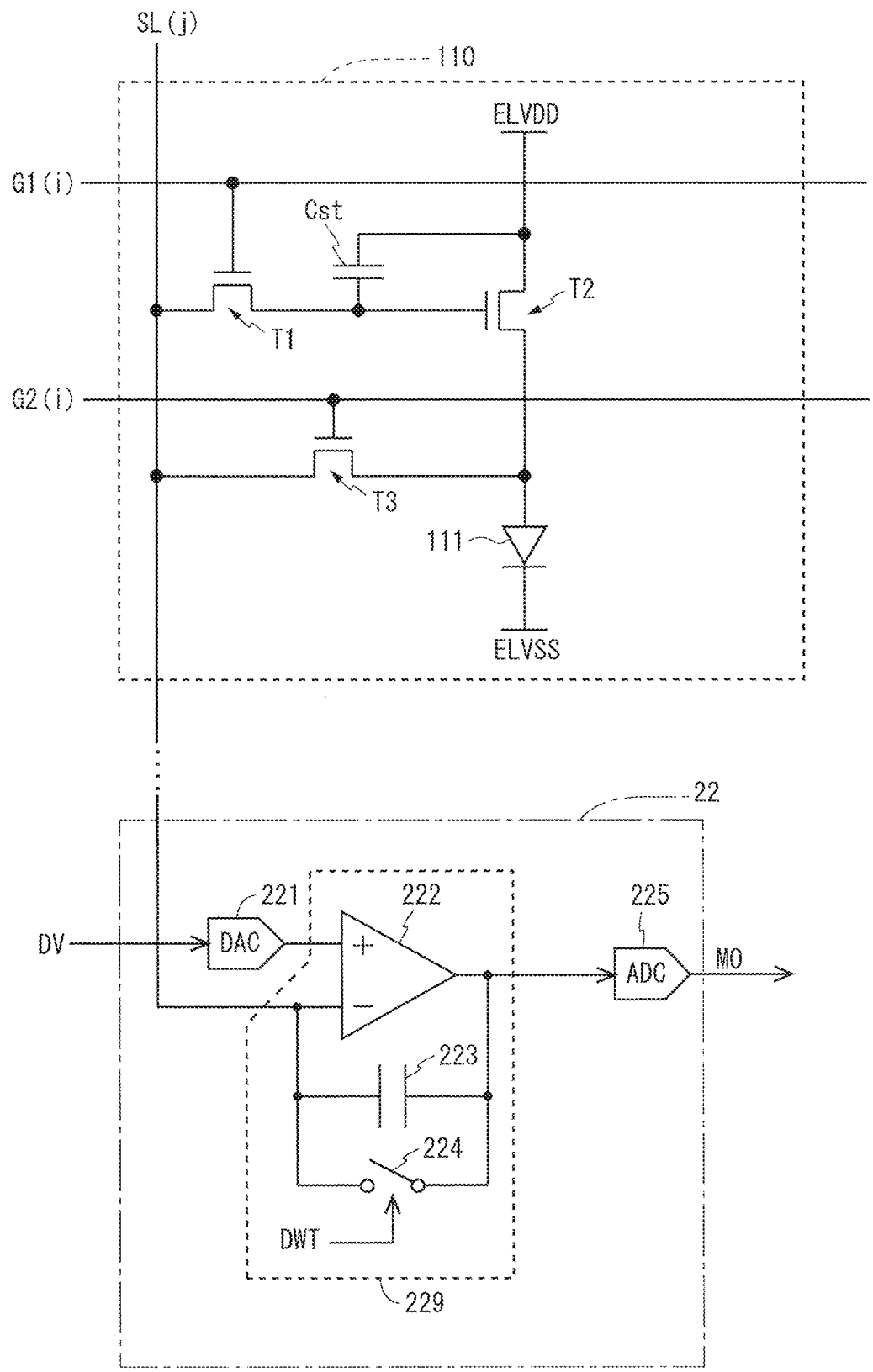
FIG. 8 is a circuit diagram showing a pixel circuit and apart of the source driver (a portion that functions as a current monitoring unit) in the first embodiment.

FIG. 8 is a circuit diagram showing a pixel circuit 110 and a part of the source driver 20 (a portion that functions as the current monitoring unit 22). Note that FIG. 8 shows a pixel circuit 110 in an ith row and a jth column and a portion of the source driver 20 corresponding to a data signal line SL(j) in the jth column. The pixel circuit 110 includes one organic EL element 111 serving as a display element, three transistors T1 to T3, and one capacitor Cst. The transistor T1 functions as an input transistor that selects a pixel, the transistor T2 functions as a drive transistor that controls supply of a current (drive current) to the organic EL element 111, and the transistor T3 functions as a monitoring control transistor that controls whether to perform current measurement for detecting a characteristic of the drive transistor T2 or the organic EL element 111.

The input transistor T1 is connected at its control terminal to a scanning signal line G1(i), connected at its first conductive terminal to the data signal line SL(j), and connected at its second conductive terminal to a control terminal of the drive transistor T2 and one end of the capacitor Cst. The drive transistor T2 is connected at its control terminal to the second conductive terminal of the input transistor T1 and the one end of the capacitor Cst, connected at its first conductive terminal to a high-level power line and the other end of the capacitor Cst, and connected at its second conductive terminal to a first conductive terminal of the monitoring control transistor T3 and an anode electrode of the organic EL element 111. The monitoring control transistor T3 is connected at its control terminal to a monitoring control line G2(i), connected at its first conductive terminal to the second conductive terminal of the drive transistor T2 and the anode electrode of the organic EL element 111, and connected at its source terminal to the data signal line SL(j). The capacitor Cst is connected at its one end to the control terminal of the drive transistor T2 and the second conductive terminal of the input transistor T1, and connected at its other end to the first conductive terminal of the drive transistor T2 and the high-level power line. The organic EL element 111 is connected at its anode electrode to the second conductive terminal of the drive transistor T2 and the first conductive terminal of the monitoring control transistor T3. Note that a cathode electrode is shared by a plurality of organic EL elements 111, and the divided cathode electrodes 156(1) to 156(4) shown in FIG. 7 are connected to a power supply circuit that supplies a low-level power supply voltage ELVSS. The potential of the low-level power supply voltage ELVSS is a fixed potential that allows a drive current to flow through the organic EL element 111.

As shown in FIG. 8, the current monitoring unit 22 includes a DA converter (DAC) 221, an operational amplifier 222, a capacitor 223, a switch 224, and an AD converter (ADC) 225. The operational amplifier 222, the capacitor 223, and the switch 224 form a current/voltage converting unit 229. Note that the current/voltage converting unit 229 and the DA converter 221 also function as components of the data signal line driving unit 21.

A digital video signal DV is provided to an input terminal of the DA converter 221. The DA converter 221 converts the digital video signal DV into an analog voltage. The analog voltage is a video signal voltage or a monitoring voltage. An output terminal of the DA converter 221 is connected to a non-inverting input terminal of the operational amplifier 222. Thus, a video signal voltage or a monitoring voltage is provided to the non-inverting input terminal of the operational amplifier 222. An inverting input terminal of the operational amplifier 222 is connected to the data signal line SL(j). The switch 224 is provided between the inverting input terminal and output terminal of the operational amplifier 222. The capacitor 223 is provided in parallel to the switch 224 and between the inverting input terminal and output terminal of the operational amplifier 222. An input and output control signal DWT included in the source control signals SCTL is provided to a control terminal of the switch 224. The output terminal of the operational amplifier 222 is connected to an input terminal of the AD converter 225.

In a configuration such as that described above, when the input and output control signal DWT is at a high level, the switch 224 is in an on state, and a short-circuit state occurs between the inverting input terminal and output terminal of the operational amplifier 222. At this time, the operational amplifier 222 functions as a buffer amplifier. By this, a voltage (a video signal voltage or a monitoring voltage) provided to the non-inverting input terminal of the operational amplifier 222 is applied to the data signal line SL(j). When the input and output control signal DWT is at a low level, the switch 224 is an off state, and the inverting input terminal and output terminal of the operational amplifier 222 are connected to each other through the capacitor 223. At this time, the operational amplifier 222 and the capacitor 223 function as an integrator circuit. By this, an output voltage from the operational amplifier 222 is a voltage based on a current flowing through the data signal line SL(j). The AD converter 225 converts the output voltage from the operational amplifier 222 into a digital value. Data obtained after the conversion is sent as monitoring data MO to the display control circuit 30.

Note that although, in the present embodiment, it is configured such that a signal line for supplying a data signal and a signal line for measuring a current are shared, the configuration is not limited thereto. A configuration can also be adopted in which a signal line for supplying a data signal and a signal line for measuring a current are provided independently of each other. In addition, for the configuration of the pixel circuit 110, too, other configurations than the configuration shown in FIG. 8 can also be adopted. That is, there are no particular limitations on specific circuit configurations of the current monitoring unit 22 and the pixel circuit 110.

<1.4 Characteristic Detection Process>

Figure 9:
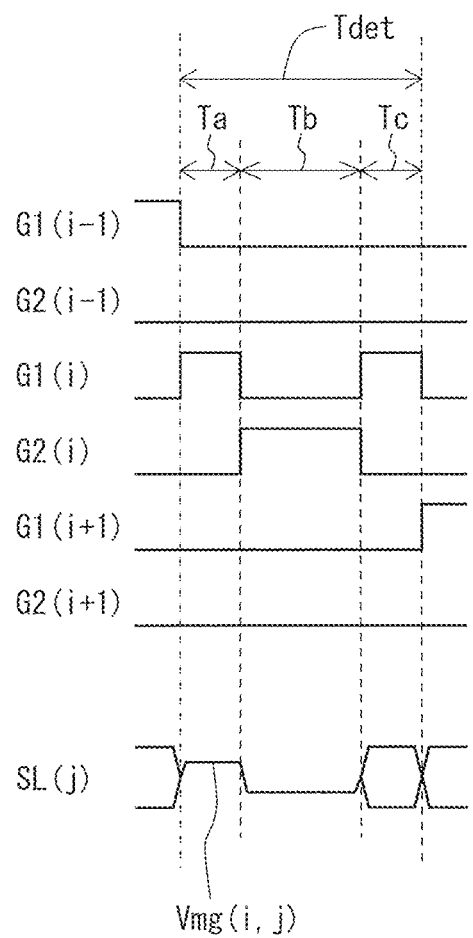
FIG. 9 is a timing chart for describing a driving method for performing a characteristic detection process in the first embodiment.

Next, a characteristic detection process will be described. FIG. 9 is a timing chart for describing a driving method for performing the characteristic detection process. Note that FIG. 9 shows an example in which the characteristic detection process is performed for an ith row. In FIG. 9, a period indicated by reference character Tdet is a characteristic detection period. The characteristic detection period Tdet includes a period during which preparation for detecting a TFT characteristic or an OLED characteristic is performed in a row that is a target for the characteristic detection process (hereinafter, referred to as "detection preparation period".) Ta; a current measurement period Tb during which a current is actually measured; and a period during which writing of a video signal voltage (a voltage corresponding to a normal display image) is performed in the row that is the target for the characteristic detection process (hereinafter, referred to as "video signal voltage writing period".) Tc.

During the detection preparation period Ta, a scanning signal line G1(i) is brought into an active state, and a monitoring control line G2(i) is maintained in a non-active state. By this, the input transistor T1 is in an on state, and the monitoring control transistor T3 is maintained in an off state. In addition, during the detection preparation period Ta, a monitoring voltage Vmg(i, j) is applied to a data signal line SL(j). Note that the monitoring voltage Vmg(i, j) does not indicate a given fixed voltage, and the magnitude of the monitoring voltage Vmg(i, j) differs between when a TFT characteristic is detected and when an OLED characteristic is detected. That is, the monitoring voltage used here is a concept including both a monitoring voltage for detecting a TFT characteristic (hereinafter, referred to as "TFT characteristic measurement voltage") and a monitoring voltage for detecting an OLED characteristic (hereinafter, referred to as "OLED characteristic measurement voltage"). When the monitoring voltage Vmg(i, j) is the TFT characteristic measurement voltage, the drive transistor T2 is in an on state. When the monitoring voltage Vmg (i, j) is the OLED characteristic measurement voltage, the drive transistor T2 is maintained in an off state.

Figure 10:
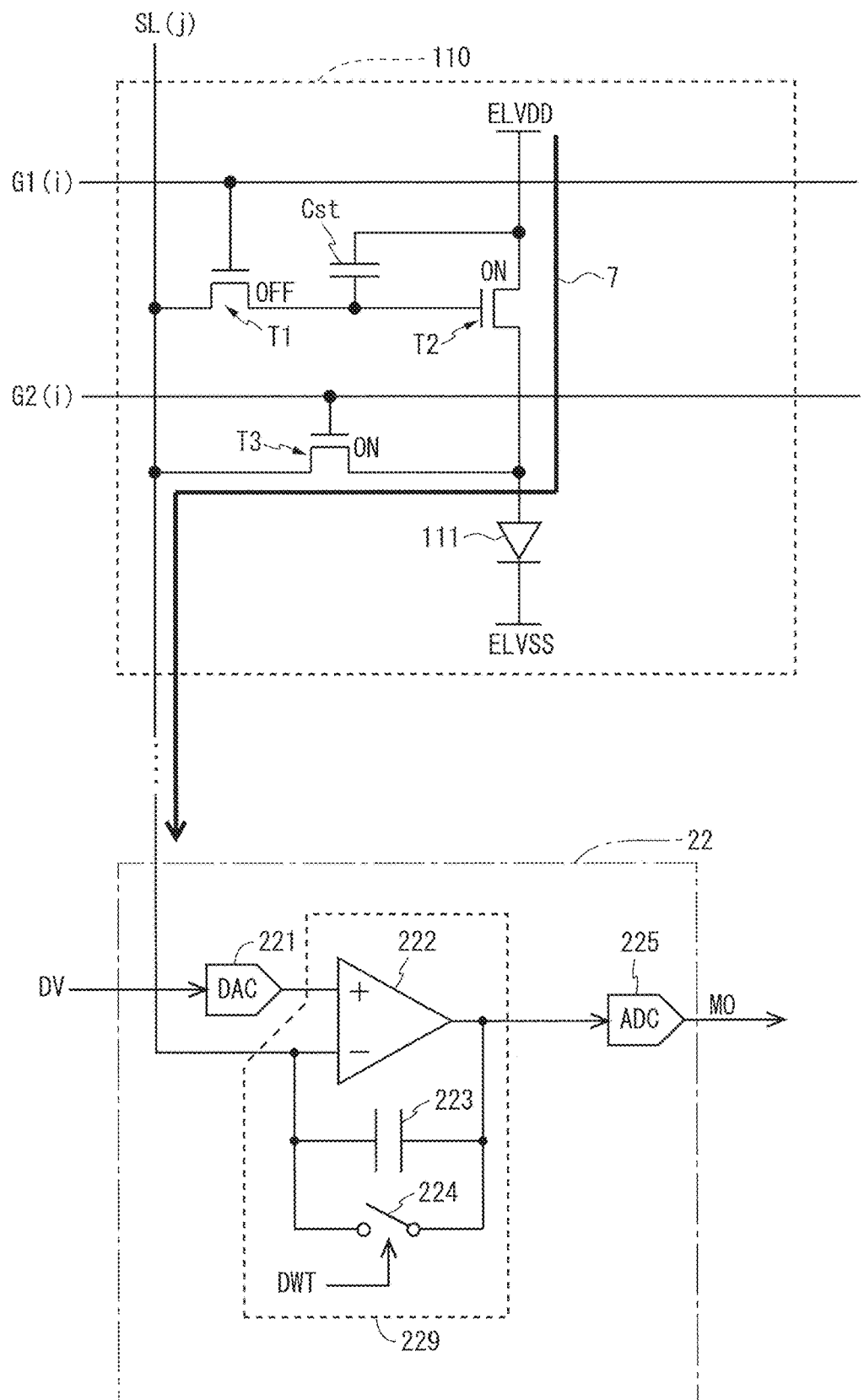
FIG. 10 is a diagram for describing the flow of a current during a current measurement period when a characteristic of a drive transistor is detected in the first embodiment.
Figure 11:
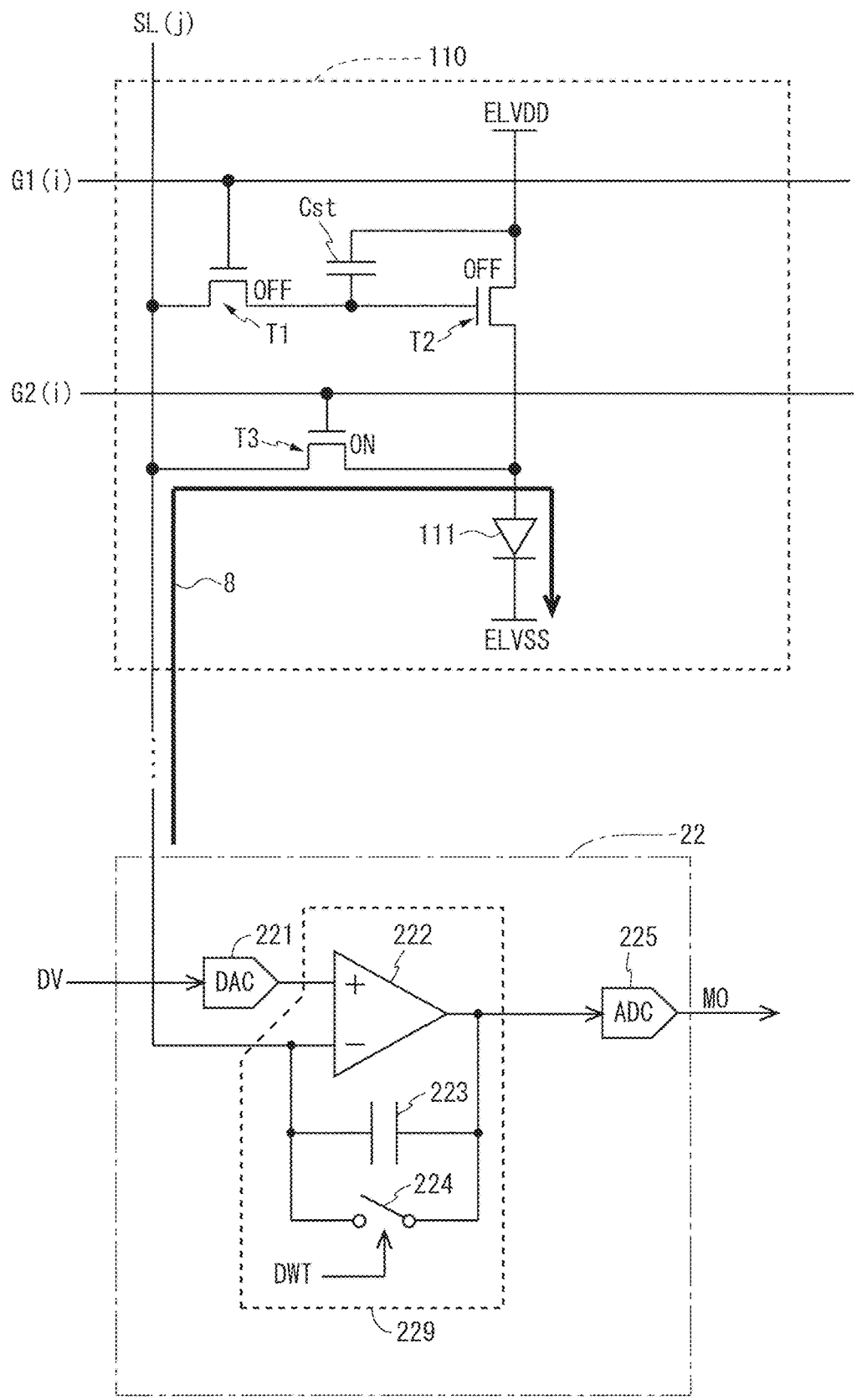
FIG. 11 is a diagram for describing the flow of a current during a current measurement period when a characteristic of an organic EL element is detected in the first embodiment.

During the current measurement period Tb, the scanning signal line G1(i) is brought into a non-active state and the monitoring control line G2(i) is brought into an active state. By this, the input transistor T1 is in an off state and the monitoring control transistor T3 is in an on state. Here, when the monitoring voltage Vmg(i, j) is the TFT characteristic measurement voltage, the drive transistor T2 is maintained in an on state and a current does not flow through the organic EL element 111. Thus, as indicated by an arrow given reference character 7 in FIG. 10, a current flowing through the drive transistor T2 is outputted to the data signal line SL(j) through the monitoring control transistor T3. In this state, the current flowing through the data signal line SL(j) is measured by the current monitoring unit 22 in the source driver 20. On the other hand, when the monitoring voltage Vmg(i, j) is the OLED characteristic measurement voltage, the drive transistor T2 is maintained in an off state and a current flows through the organic EL element 111. That is, as indicated by an arrow given reference character 8 in FIG. 11, a current flows through the organic EL element 111 from the data signal line SL(j) through the monitoring control transistor T3. In this state, the current flowing through the data signal line SL(j) is measured by the current monitoring unit 22 in the source driver 20.

Figure 12:
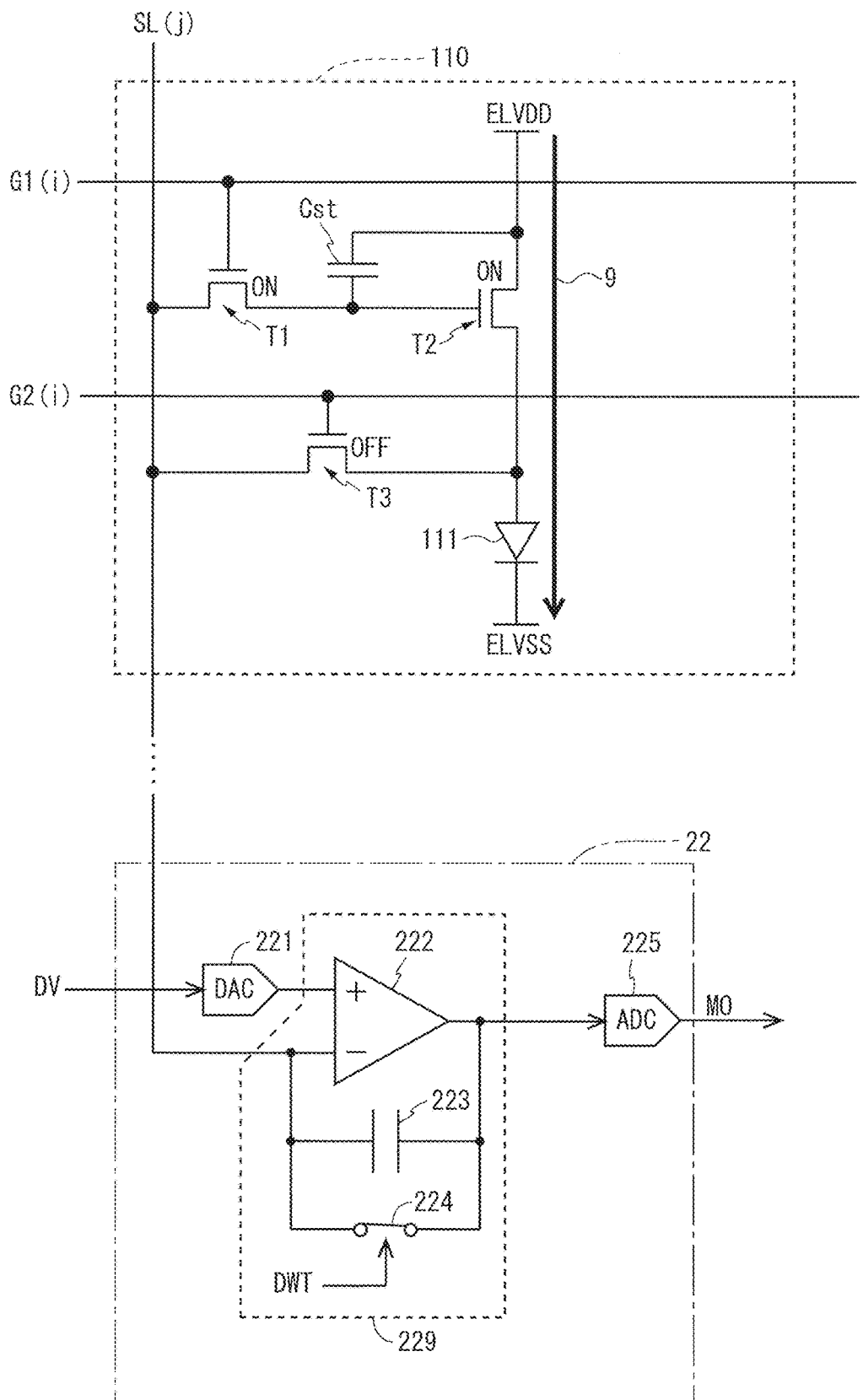
FIG. 12 is a diagram for describing the flow of a current during a video signal voltage writing period in the first embodiment.

During the video signal voltage writing period Tc, the scanning signal line G1(i) is brought into an active state and the monitoring control line G2(i) is brought into a non-active state. By this, the input transistor T1 is in an on state and the monitoring control transistor T3 is in an off state. In addition, during the video signal voltage writing period Tc, a voltage (video signal voltage) based on target luminance is applied to the data signal line SL(j). By this, the drive transistor T2 goes into an on state. As a result, as indicated by an arrow given reference character 9 in FIG. 12, a drive current is supplied to the organic EL element 111 through the drive transistor T2. By this, the organic EL element 111 emits light at luminance determined based on the drive current.

<1.5 Control Method>

Next, with reference to FIGS. 1 and 13 to 17, a relationship between an image writing process (a process of writing a data signal generated based on an image to be displayed on the display unit 11 to a pixel circuit 110), the characteristic detection process, and a touch driving process (a process of applying a driving signal SD to sensor electrodes 61 to perform touch detection) will be described. Note that in the present embodiment, both the frame rate for image display and the scan rate for touch detection are 60 Hz. In the following, for the sake of convenience, a block corresponding to a pixel row that is a target for the characteristic detection process is referred to as "characteristic detection target block", and a block that is a target for the touch driving process is referred to as "touch driving target block".

Figure 1:
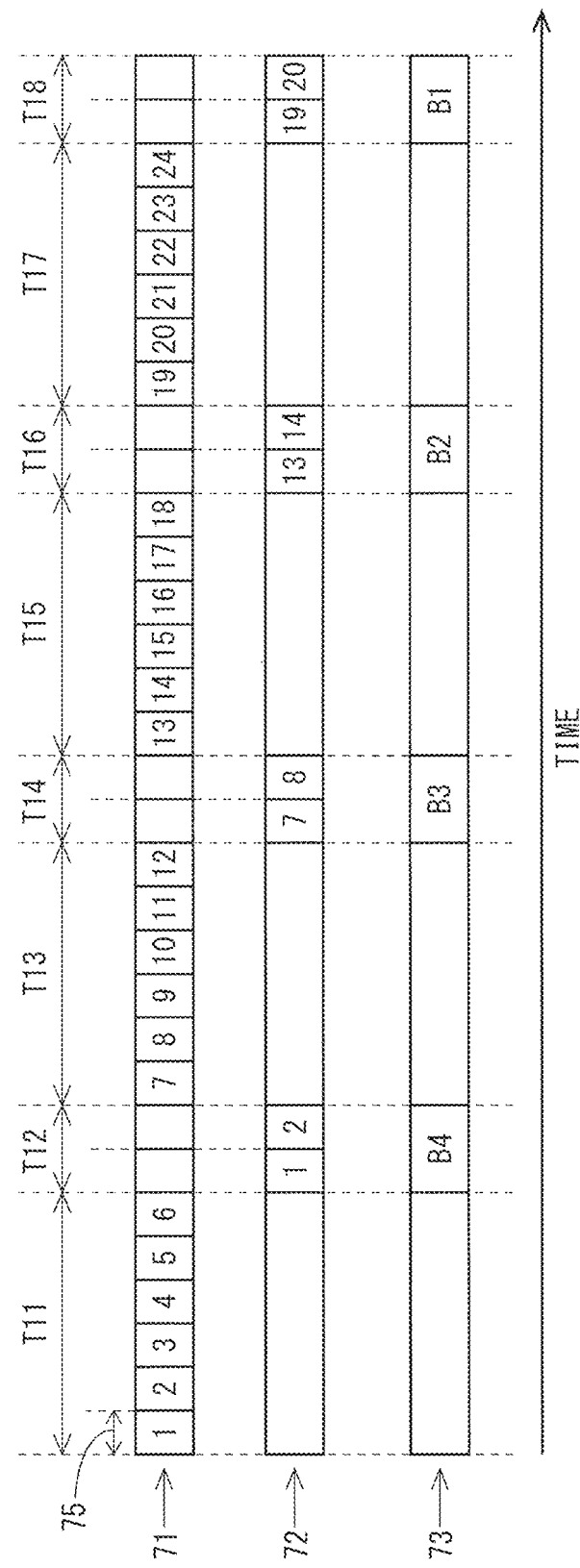
FIG. 1 is a diagram for describing a relationship between an image writing process, a characteristic detection process, and a touch driving process in a first embodiment.
Figure 13:
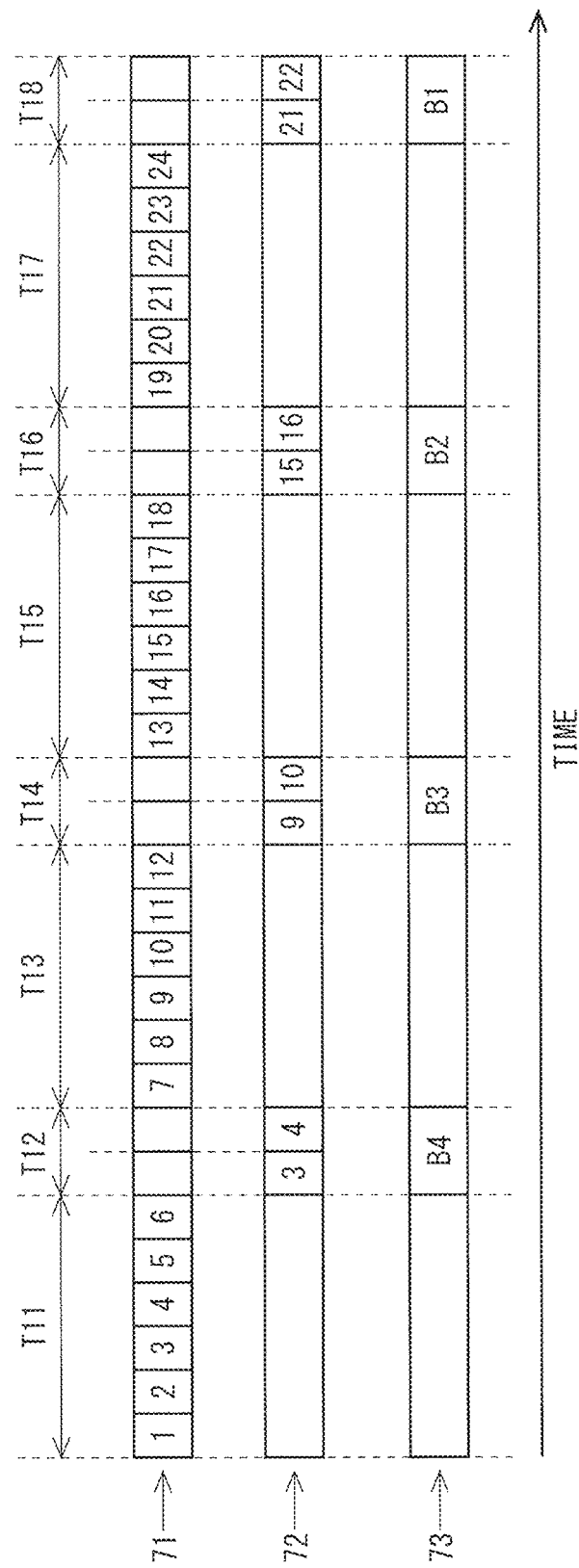
FIG. 13 is a diagram for describing a relationship between an image writing process, a characteristic detection process, and a touch driving process in the first embodiment.
Figure 14:
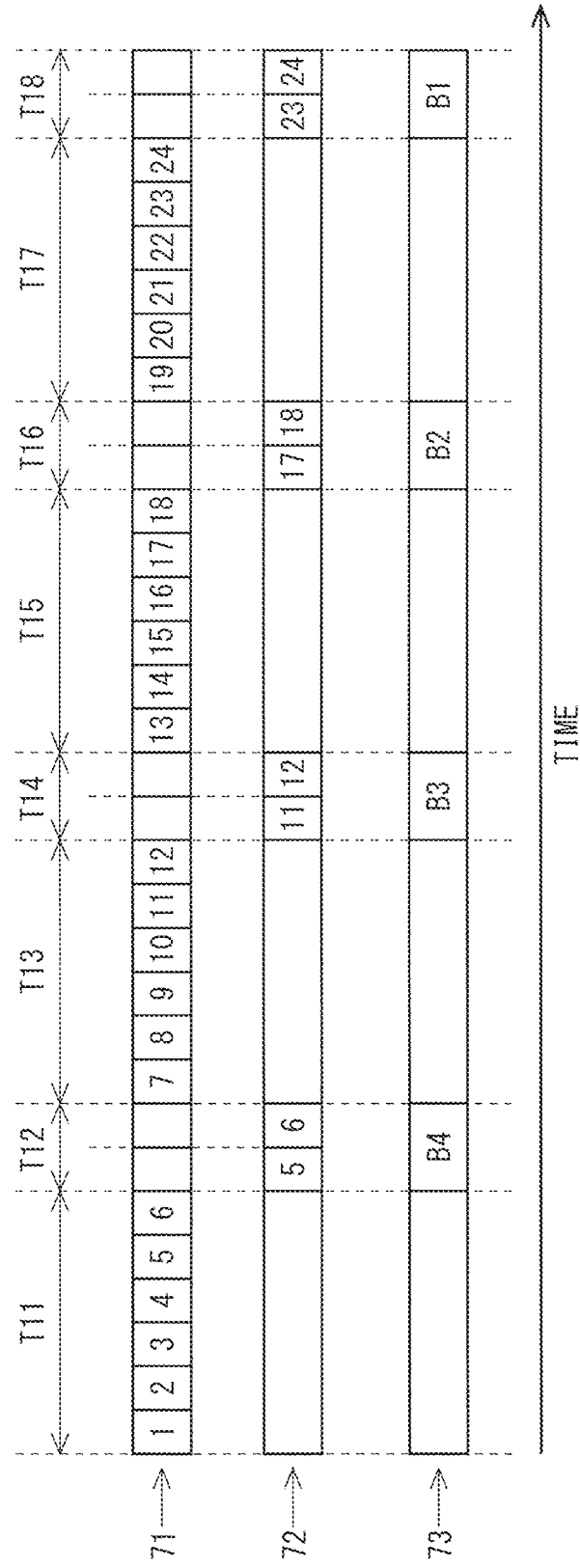
FIG. 14 is a diagram for describing a relationship between an image writing process, a characteristic detection process, and a touch driving process in the first embodiment.

FIGS. 1, 13, and 14 show a relationship between the image writing process, the characteristic detection process, and the touch driving process in three consecutive frame periods. In these drawings, a portion indicated by an arrow given reference character 71 shows a row of sensor electrodes 61 whose corresponding pixel rows are subjected to the image writing process, a portion indicated by an arrow given reference character 72 shows a row of sensor electrodes 61 whose corresponding pixel rows are subjected to the characteristic detection process, and a portion indicated by an arrow given reference character 73 shows the touch driving target block. Note that for the portion indicated by the arrow given reference character 73, B1 to B4 represent the above-described first block BLK(1) to fourth block BLK(4), respectively.

In the first frame, as shown in FIG. 1, during a period T11, the image writing process is performed in pixel rows corresponding to sensor electrodes 61 in the 1st to 6th rows, and during a period T12, the characteristic detection process is performed in pixel rows corresponding to sensor electrodes 61 in the 1st and 2nd rows, and the touch driving process is performed in the fourth block BLK(4). Thereafter, during a period T13, the image writing process is performed in pixel rows corresponding to sensor electrodes 61 in the 7th to 12th rows, and during a period T14, the characteristic detection process is performed in pixel rows corresponding to sensor electrodes 61 in the 7th and 8th rows, and the touch driving process is performed in the third block BLK(3). Thereafter, during a period T15, the image writing process is performed in pixel rows corresponding to sensor electrodes 61 in the 13th to 18th rows, and during a period T16, the characteristic detection process is performed in pixel rows corresponding to sensor electrodes 61 in the 13th and 14th rows, and the touch driving process is performed in the second block BLK(2). Thereafter, during a period T17, the image writing process is performed in pixel rows corresponding to sensor electrodes 61 in the 19th to 24th rows, and during a period T18, the characteristic detection process is performed in pixel rows corresponding to sensor electrodes 61 in the 19th and 20th rows, and the touch driving process is performed in the first block BLK(1).

As such, the touch driving process is not performed during a period during which the image writing process is performed, but the touch driving process is performed during a period during which the characteristic detection process is performed. In addition, when taking a look at periods (T12, T14, T16, and T18) during which the characteristic detection process and the touch driving process are performed, for all of these periods, a block different from a characteristic detection target block serves as a touch driving target block.

Note that during a period indicated by an arrow given reference character 75 in FIG. 1, the image writing process is performed in pixel rows corresponding to sensor electrodes 61 in the first row. Regarding this, a region including sensor electrodes 61 for one row corresponds to a region including a plurality of pixel rows. In addition, writing of a data signal to a pixel circuit 110 is performed on one pixel row during each horizontal scanning period. Thus, the period indicated by the arrow given reference character 75 in FIG. 1 corresponds to a plurality of horizontal scanning periods.

In the second frame, as can be grasped from FIG. 13, the image writing process and the touch driving process are performed in the same manner as in the first frame. Different from in the first frame, the characteristic detection process is performed in pixel rows corresponding to sensor electrodes 61 in the 3rd and 4th rows during a period T12, is performed in pixel rows corresponding to sensor electrodes 61 in the 9th and 10th rows during a period T14, is performed in pixel rows corresponding to sensor electrodes 61 in the 15th and 16th rows during a period T16, and is performed in pixel rows corresponding to sensor electrodes 61 in the 21st and 22nd rows during a period T18. As such, for the second frame, too, when taking a look at periods during which the characteristic detection process and the touch driving process are performed, for all of these periods, a block different from a characteristic detection target block serves as a touch driving target block.

In the third frame, as can be grasped from FIG. 14, the image writing process and the touch driving process are performed in the same manner as in the first frame. Different from in the first frame and the second frame, the characteristic detection process is performed in pixel rows corresponding to sensor electrodes 61 in the 5th and 6th rows during a period T12, is performed in pixel rows corresponding to sensor electrodes 61 in the 11th and 12th rows during a period 114, is performed in pixel rows corresponding to sensor electrodes 61 in the 17th and 18th rows during a period T16, and is performed in pixel rows corresponding to sensor electrodes 61 in the 23rd and 24th rows during a period T18. As such, for the third frame, too, when taking a look at periods during which the characteristic detection process and the touch driving process are performed, for all of these periods, a block different from a characteristic detection target block serves as a touch driving target block.

As can be grasped from FIGS. 1, 13, and 14, in each frame period, the characteristic detection process is performed in turn from the top of the display unit 11 (a one-edge side in a direction in which the data signal lines SL extend) to the bottom thereof (another-edge side in the direction in which the data signal lines SL extend), and the touch driving process is performed in turn from the bottom of the display unit 11 to top thereof. That is, in each frame period, the characteristic detection process is performed such that the characteristic detection target block shifts one block by one block from a block corresponding to the first row (here, the first block BLK(1)) to a block corresponding to an nth row (here, the fourth block BLK(4)). In addition, in each frame period, the touch driving process (application of a driving signal SD to the sensor electrodes 61 of 24 rows×16 columns) is performed such that the touch driving target block shifts one block by one block from a block corresponding to the nth row (here, the fourth block BLK(4)) to a block corresponding to the first row (here, the first block BLK(1)). Here, in the present embodiment, the number of blocks is four. Therefore, during the operation of the organic EL display device, the characteristic detection target block and the touch driving target block cannot be identical blocks.

Figure 15:
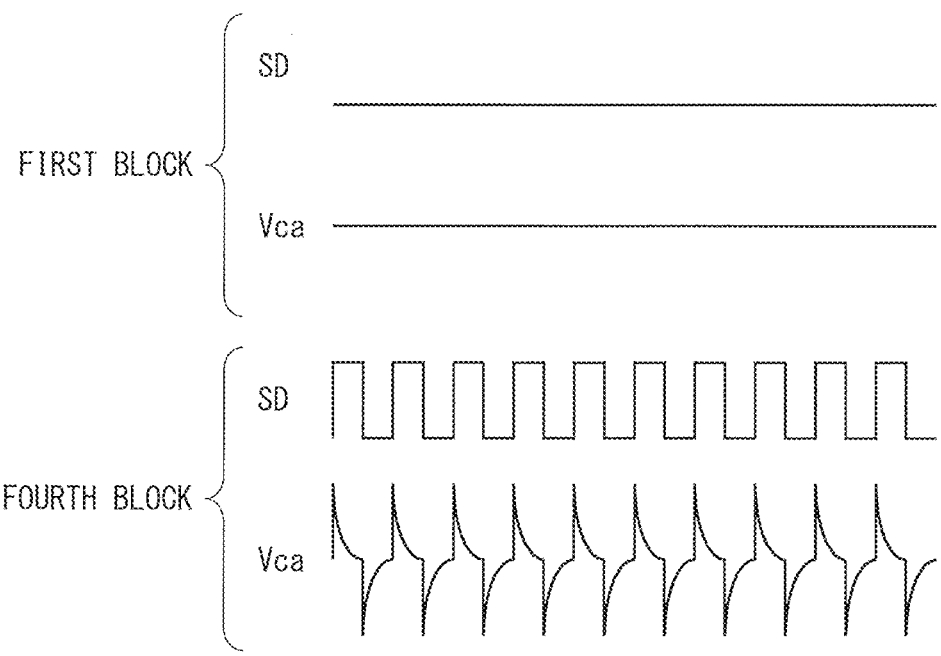
FIG. 15 is a diagram for describing the influence of noise exerted on a cathode electrode during a period during which a touch driving process is performed in a fourth block in the first embodiment.

Now, the period T12 and the period T18 in FIG. 1 are taken a look at. FIG. 15 shows the waveforms of a driving signal SD and a potential Vca of a cathode electrode 156 in the period T12 (strictly speaking, a current measurement period in the period T12). During the period T12, since the touch driving process is not performed in the first block BLK(1), the potential Vca of the cathode electrode 156(1) corresponding to the first block BLK(1) is maintained at a constant level. During the period T12, since the touch driving process is performed in the fourth block BLK(4), due to application of the driving signal SD to sensor electrodes 61 belonging to the fourth block BLK(4), the potential Vca of the cathode electrode 156(4) corresponding to the fourth block BLK(4) fluctuates up and down.

Figure 16:
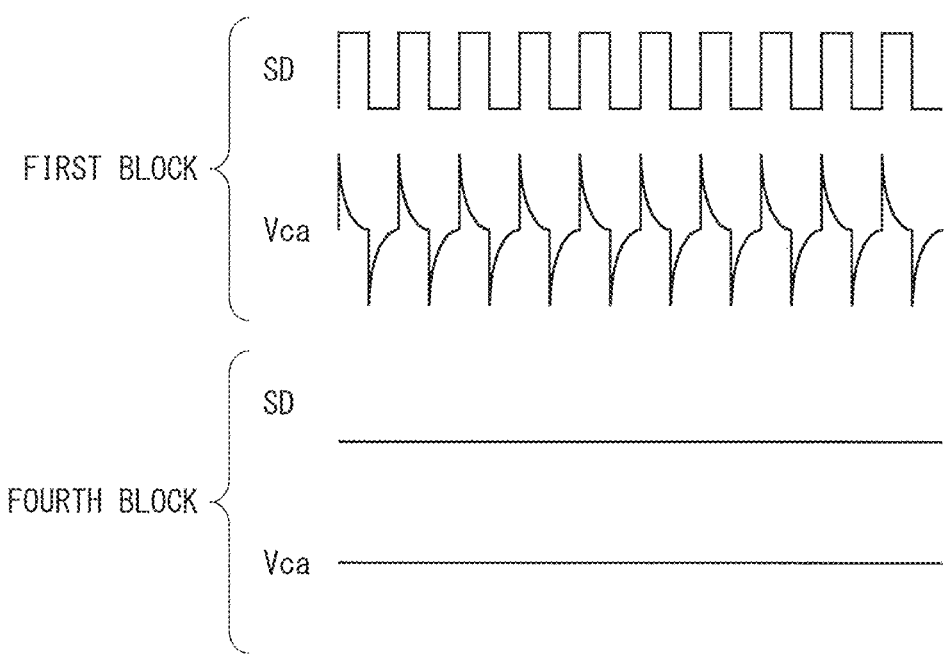
FIG. 16 is a diagram for describing the influence of noise exerted on a cathode electrode during a period during which a touch driving process is performed in a first block in the first embodiment.

FIG. 16 shows the waveforms of a driving signal SD and a potential Vca of a cathode electrode 156 in the period T18 (strictly speaking, a current measurement period in the period T18). During the period T18, since the touch driving process is performed in the first block BLK(1), due to application of the driving signal SD to sensor electrodes 61 belonging to the first block BLK(1), the potential Vca of the cathode electrode 156(1) corresponding to the first block BLK(1) fluctuates up and down. During the period T18, since the touch driving process is not performed in the fourth block BLK(4), the potential Vca of the cathode electrode 156(4) corresponding to the fourth block BLK(4) is maintained at a constant level.

Figure 17:
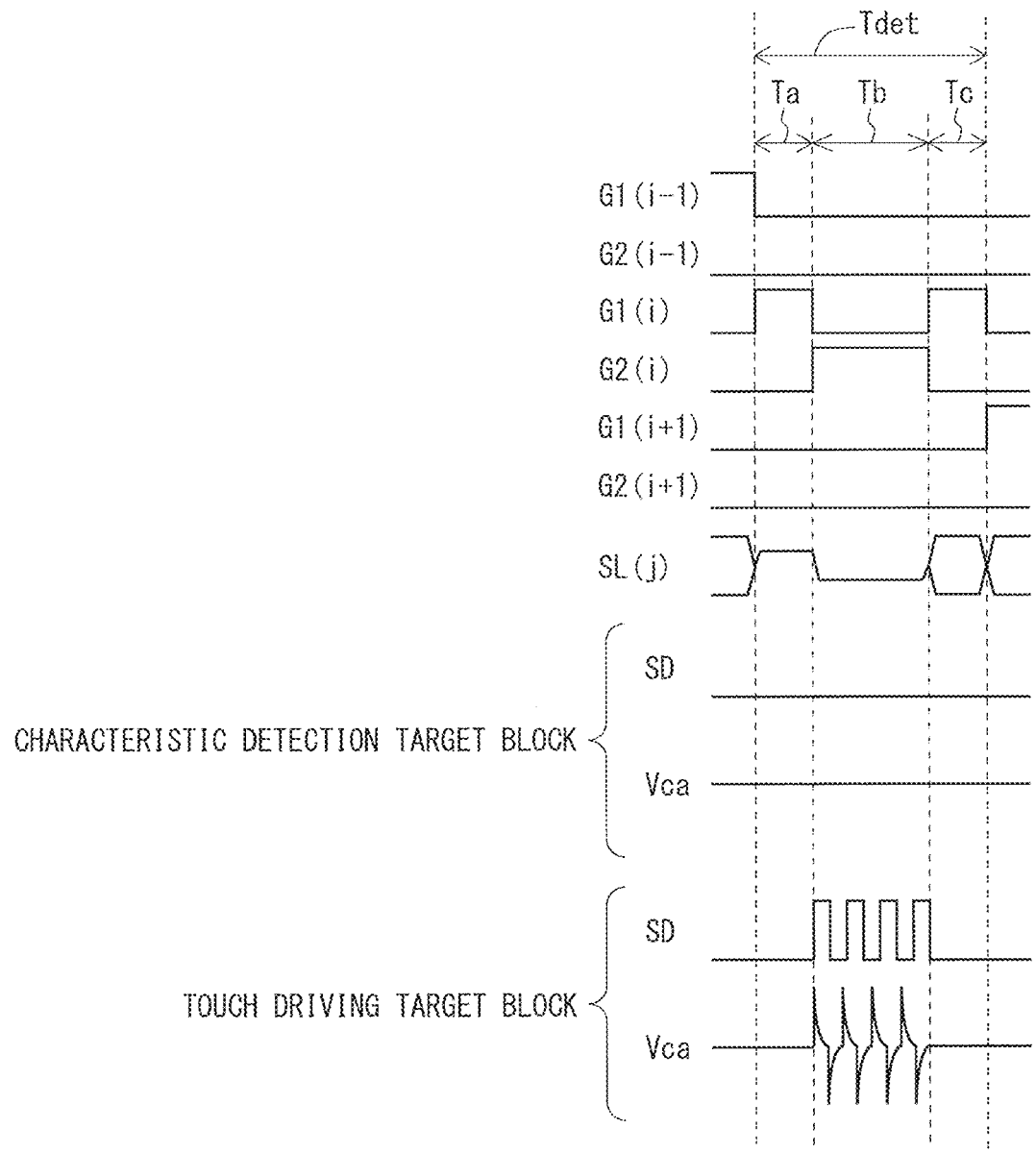
FIG. 17 is a diagram for describing the influence of noise exerted on a cathode electrode during a current measurement period in the first embodiment.

As such, since the characteristic detection target block and the touch driving target block cannot be identical blocks, even if large noise has occurred in the cathode electrode 156 in the touch driving target block, noise does not occur almost at all in the cathode electrode 156 in the characteristic detection target block. That is, as shown in FIG. 17, during the current measurement period Tb in the characteristic detection period Tdet, in the touch driving target block, the potential Vca of the cathode electrode 156 fluctuates due to application of the driving signal SD to sensor electrodes 61, whereas in the characteristic detection target block, since application of the driving signal SD to sensor electrodes 61 is not performed, the potential Vca of the cathode electrode 156 is maintained at a constant level.

Meanwhile, in order to enable control such as that described above, in the present embodiment, as described above, a monitoring enable signal MO_EN and synchronizing signals SY such as a horizontal synchronizing signal and a vertical synchronizing signal are sent to the touch panel controller 40 from the display control circuit 30. Then, the drive control unit 41 in the touch panel controller 40 identifies, based on the synchronizing signals SY and the monitoring enable signal MO_EN, the start and end timing of the characteristic detection period Tdet and the current measurement period Tb, a block corresponding to pixel rows that are targets for the image writing process, the characteristic detection target block, etc.

Note that in the present embodiment, an image writing step is implemented by a process of allowing the gate driver 13 and the source driver 20 to operate during the periods T11, T13, T15, and T17 so that a data signal based on an image to be displayed on the display unit 11 is written to each pixel circuit 110, a characteristic detecting step is implemented by a process of allowing the gate driver 13 and the source driver 20 to operate during the periods T12, 114, T16, and T18 so that the characteristic detection process is performed, and a touch position detecting step is implemented by a process of allowing the touch panel controller 40 to operate during the periods T12, T14, T16, and T18 so that a touch position is detected.

<1.6 Effects>

According to the present embodiment, the sensor electrodes 61 for touch detection are divided into four blocks, and the cathode electrode 156 that is divided into four parts so as to correspond to the four blocks is used. Under such a configuration, the touch driving process is not performed during a period during which the image writing process is performed in any of the pixel rows, but is performed in a block different from a characteristic detection target block during the current measurement period Tb. Hence, abnormalities in the characteristic detection process caused by driving noise of the touch panel 12 do not occur, and a compensation process for compensating for degradation of the drive transistors T2 or the organic EL elements 111 is accurately performed. In addition, during a period during which the touch driving process is performed, neither the image writing process nor the characteristic detection process is performed in pixel rows corresponding to a touch driving target block, and thus, touch detection is also accurately performed. As such, according to the present embodiment, the organic EL display device including the touch panel 12 implements touch detection with sufficient accuracy without reducing the accuracy of a compensation process that uses an external compensation scheme.

<1.7 Variant>

In the above-described first embodiment, in each frame period, the characteristic detection process is performed in turn from the top of the display unit 11 to bottom thereof, and the touch driving process is performed in turn from the bottom of the display unit 11 to top thereof. However, the configuration is not limited thereto. For example, by performing the characteristic detection process and the touch driving process in order shown below, the touch driving target block can be a block other than a block adjacent to the characteristic detection target block during a period during which the touch driving process is performed.

Figure 18:
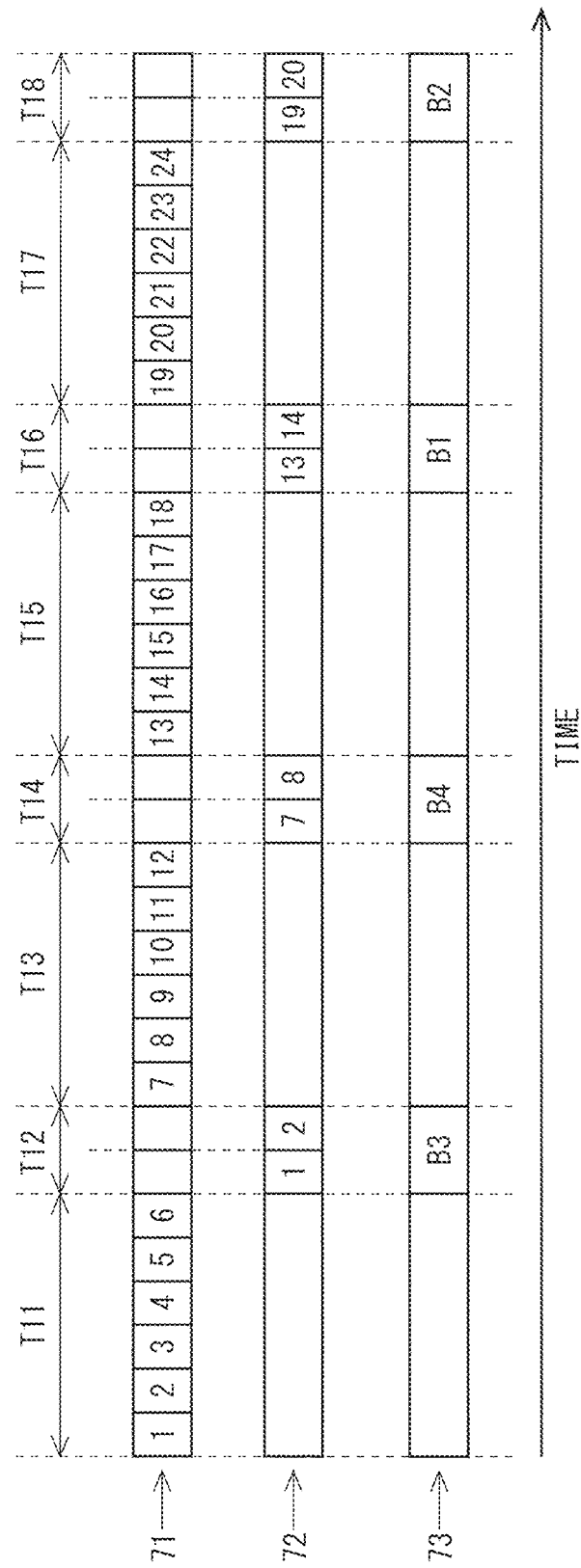
FIG. 18 is a diagram for describing a relationship between an image writing process, a characteristic detection process, and a touch driving process in a variant of the first embodiment.

In the present variant, in the first frame, as shown in FIG. 18, during a period T11, the image writing process is performed in pixel rows corresponding to sensor electrodes 61 in the 1st to 6th rows, and during a period T12, the characteristic detection process is performed in pixel rows corresponding to sensor electrodes 61 in the 1st and 2nd rows, and the touch driving process is performed in the third block BLK(3). Thereafter, during a period T13, the image writing process is performed in pixel rows corresponding to sensor electrodes 61 in the 7th to 12th rows, and during a period 114, the characteristic detection process is performed in pixel rows corresponding to sensor electrodes 61 in the 7th and 8th rows, and the touch driving process is performed in the fourth block BLK(4). Thereafter, during a period T15, the image writing process is performed in pixel rows corresponding to sensor electrodes 61 in the 13th to 18th rows, and during a period T16, the characteristic detection process is performed in pixel rows corresponding to sensor electrodes 61 in the 13th and 14th rows, and the touch driving process is performed in the first block BLK(1). Thereafter, during a period T17, the image writing process is performed in pixel rows corresponding to sensor electrodes 61 in the 19th to 24th rows, and during a period T18, the characteristic detection process is performed in pixel rows corresponding to sensor electrodes 61 in the 19th and 20th rows, and the touch driving process is performed in the second block BLK(2).

As such, the touch driving process is not performed during a period during which the image writing process is performed, but the touch driving process is performed during a period during which the characteristic detection process is performed. In addition, when taking a look at periods (T12, T14, T16, and T18) during which the characteristic detection process and the touch driving process are performed, for all of these periods, a block that is not adjacent to a characteristic detection target block serves as a touch driving target block.

Figure 19:
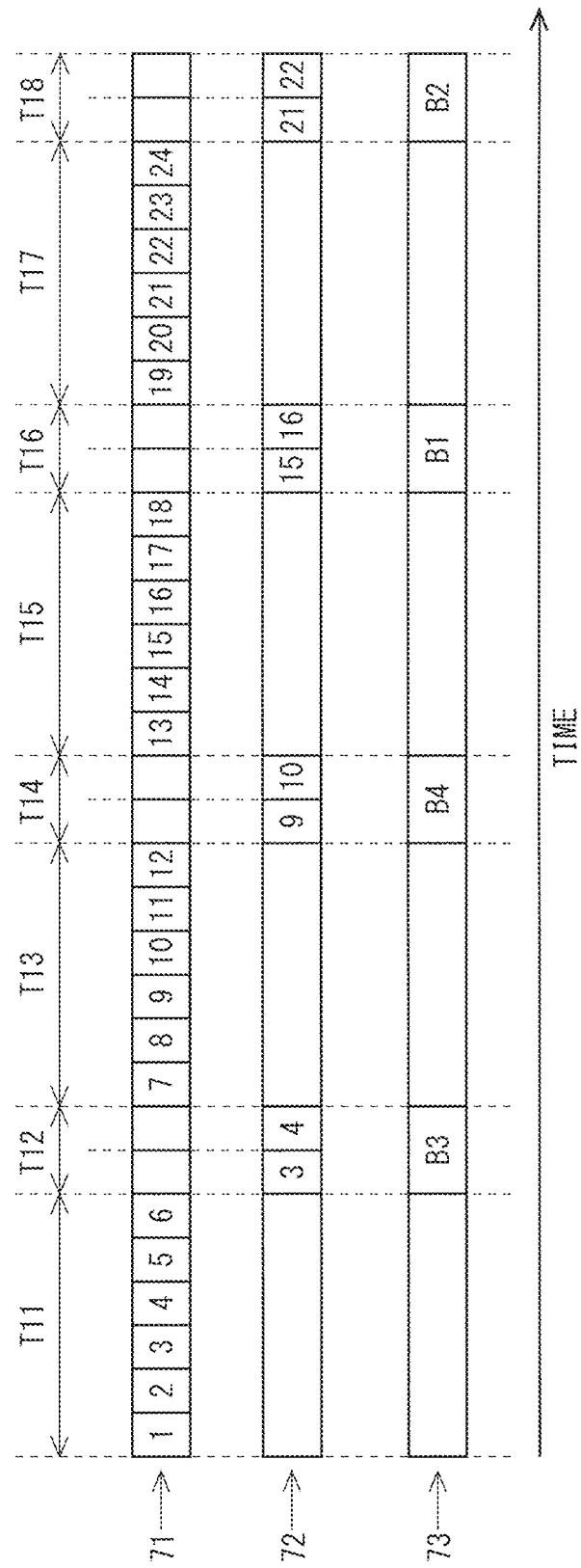
FIG. 19 is a diagram for describing a relationship between an image writing process, a characteristic detection process, and a touch driving process in the variant of the first embodiment.

In the second frame, as can be grasped from FIG. 19, the image writing process and the touch driving process are performed in the same manner as in the first frame. Different from in the first frame, the characteristic detection process is performed in pixel rows corresponding to sensor electrodes 61 in the 3rd and 4th rows during a period T12, is performed in pixel rows corresponding to sensor electrodes 61 in the 9th and 10th rows during a period T14, is performed in pixel rows corresponding to sensor electrodes 61 in the 15th and 16th rows during a period T16, and is performed in pixel rows corresponding to sensor electrodes 61 in the 21st and 22nd rows during a period T18. As such, for the second frame, too, when taking a look at periods during which the characteristic detection process and the touch driving process are performed, for all of these periods, a block that is not adjacent to a characteristic detection target block serves as a touch driving target block.

Figure 20:
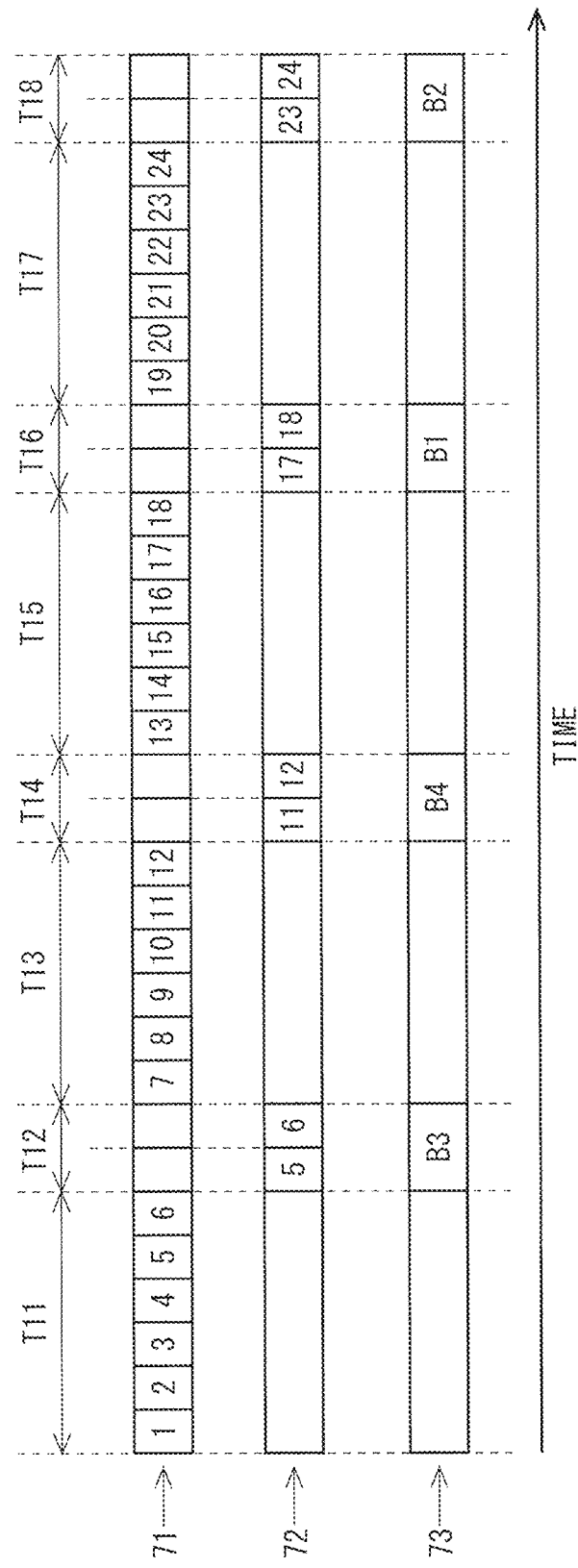
FIG. 20 is a diagram for describing a relationship between an image writing process, a characteristic detection process, and a touch driving process in the variant of the first embodiment.

In the third frame, as can be grasped from FIG. 20, the image writing process and the touch driving process are performed in the same manner as in the first frame. Different from in the first frame and the second frame, the characteristic detection process is performed in pixel rows corresponding to sensor electrodes 61 in the 5th and 6th rows during a period T12, is performed in pixel rows corresponding to sensor electrodes 61 in the 11th and 12th rows during a period 114, is performed in pixel rows corresponding to sensor electrodes 61 in the 17th and 18th rows during a period T16, and is performed in pixel rows corresponding to sensor electrodes 61 in the 23rd and 24th rows during a period T18. As such, for the third frame, too, when taking a look at periods during which the characteristic detection process and the touch driving process are performed, for all of these periods, a block that is not adjacent to a characteristic detection target block serves as a touch driving target block.

As above, in the present variant, the touch driving process is not performed during a period during which the image writing process is performed in any of the pixel rows, but is performed in a block other than a block adjacent to a characteristic detection target block during the current measurement period Tb. By this, occurrence of abnormalities in touch detection or in the characteristic detection process caused by noise is effectively prevented.

2. Second Embodiment

A second embodiment will be described. The following mainly describes differences from the first embodiment.

<2.1 Summary>

Figure 21:
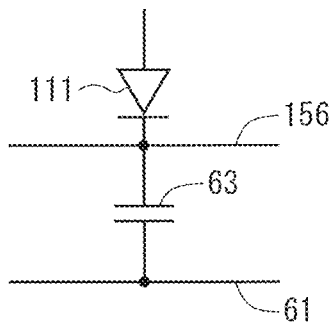
FIG. 21 is a diagram for describing formation of a parasitic capacitance between a cathode electrode and a sensor electrode in a second embodiment.

As can be grasped from FIG. 3, only the sealing layer 157 is present between the cathode electrode 156 and the touch panel layer 158. Thus, electrically, as shown in FIG. 21, a parasitic capacitance 63 is formed between the cathode electrode 156 and a sensor electrode 61. Depending on the magnitude of the parasitic capacitance 63, rounding of the waveform of a touch driving signal SD occurs. In other words, by reducing the influence of the parasitic capacitance 63, rounding of the waveform of the touch driving signal SD is reduced, enabling fast touch detection. Hence, in the present embodiment, in order to implement fast touch detection, a configuration such as that shown below is adopted.

<2.2 Configuration>

An organic EL display device according to the present embodiment is provided with a switching circuit 80 for switching a connection destination of each of the divided cathode electrodes 156(1) to 156(4), in addition to the components shown in FIG. 2. Although there are no particular limitations on a place where the switching circuit 80 is provided, the switching circuit 80 is provided, for example, in the touch panel controller 40 or in the organic EL panel 10.

Figure 22:
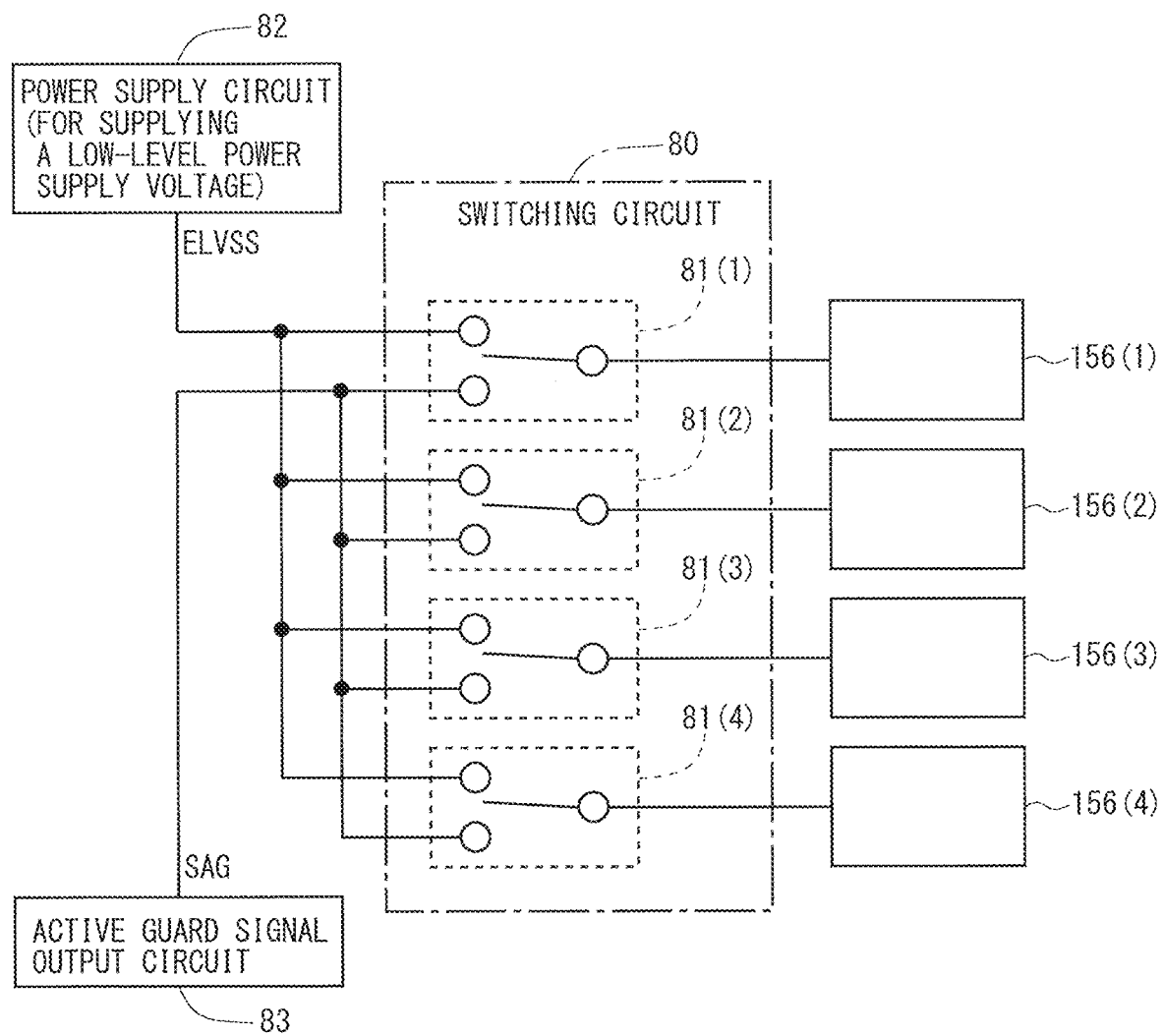
FIG. 22 is a diagram showing a configuration of a switching circuit of the second embodiment.
Figure 23:
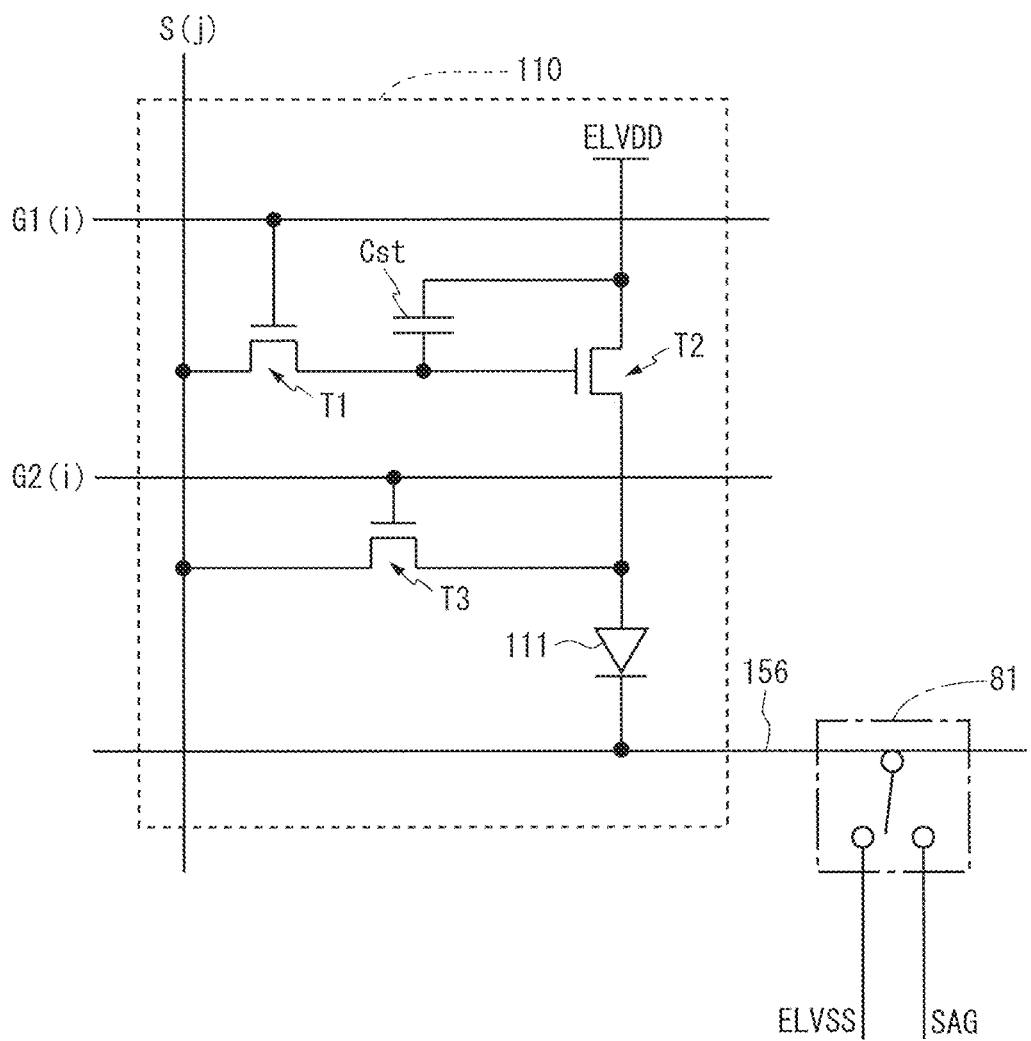
FIG. 23 is a diagram for describing provision of a low-level power supply voltage or an active guard signal to a cathode electrode of an organic EL element in a pixel circuit in the second embodiment.

FIG. 22 is a diagram showing a configuration of the switching circuit 80. In the present embodiment, the switching circuit 80 includes four switches 81(1) to 81(4). The states of the four switches 81(1) to 81(4) are controlled by, for example, a control signal sent from the display control circuit 30. By this, each switch 81 switches a connection destination of a corresponding cathode electrode 156 between a power supply circuit 82 for supplying a low-level power supply voltage and an active guard signal output circuit 83 that outputs an active guard signal SAG which is a signal having the same phase and the same potential as the touch driving signal SD. By providing the switching circuit 80 such as that described above, as shown in FIG. 23, a low-level power supply voltage ELVSS or an active guard signal SAG is provided to the cathode electrode 156 of the organic EL element 111 in each pixel circuit 110, depending on the state of the switch 81. Note that in the present embodiment, a pseudo driving signal is implemented by the active guard signal SAG, and a pseudo driving signal output circuit is implemented by the active guard signal output circuit 83.

<2.3 Control Method>

Figure 24:
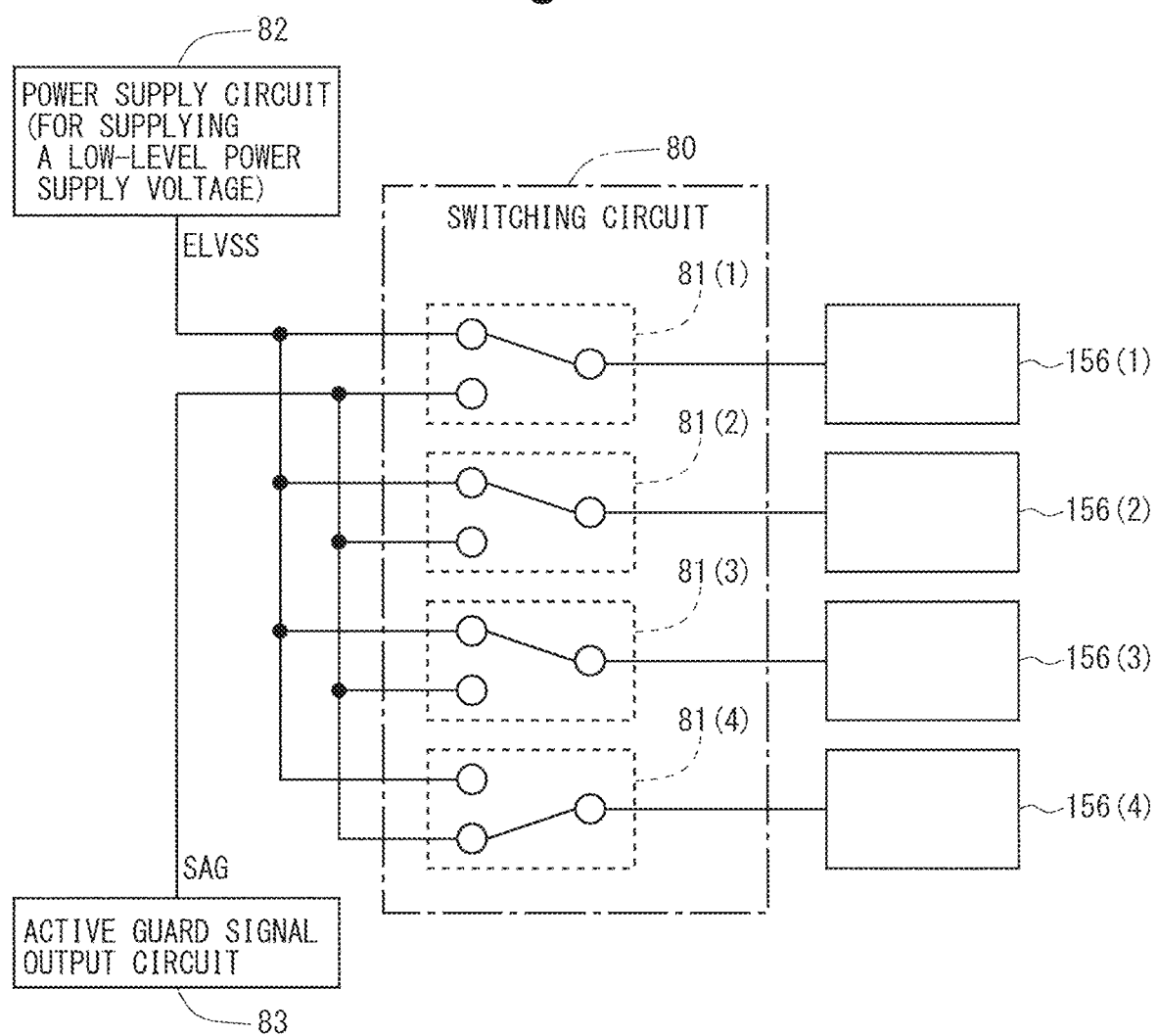
FIG. 24 is a diagram showing an example of the states of switches in the switching circuit in the second embodiment.

Next, how to control the states of the switches 81 in the switching circuit 80 will be described. If fluctuations occur in cathode potential during a period during which the image writing process is performed, then a voltage between the anode electrode and the cathode electrode changes, and thus, display quality may degrade. In addition, if fluctuations occur in cathode potential in a pixel circuit 110 in which the characteristic detection process is being performed, then measurement of a current is not properly performed. Hence, the states of the four switches 81(1) to 81(4) are controlled such that an active guard signal SAG is applied only to a cathode electrode 156 corresponding to the touch driving target block during the current measurement period. That is, during periods other than the current measurement period, the states of the four switches 81(1) to 81(4) are controlled such that all of the divided cathode electrodes 156(1) to 156(4) are connected to the power supply circuit 82 (see FIG. 22). Further, during the current measurement period, the states of the four switches 81(1) to 81(4) are controlled such that a divided cathode electrode 156 corresponding to the touch driving target block is connected to the active guard signal output circuit 83, and divided cathode electrodes 156 corresponding to blocks other than the touch driving target block are connected to the power supply circuit 82. For example, if the touch driving target block is the fourth block BLK(4) during a given current measurement period, then during the current measurement period, as shown in FIG. 24, only the cathode electrode 156(4) corresponding to the fourth block BLK(4) is connected to the active guard signal output circuit 83, and the cathode electrodes 156(1) to 156(3) corresponding to the first to third blocks BLK(1) to BLK(3) are connected to the power supply circuit 82.

<2.4 Effects>

According to the present embodiment, to a cathode electrode 156 corresponding to the touch driving target block is applied an active guard signal SAG which is a signal having the same phase and the same potential as a touch driving signal SD during a period during which the touch driving signal SD is applied to the sensor electrodes 61. Hence, in the touch driving target block, the cathode potential changes in the same manner as the potential of the sensor electrode 61 during the period during which the touch driving signal SD is applied to the sensor electrodes 61. By this, for a touch driving process, the influence of a parasitic capacitance 63 (see FIG. 21) between the cathode electrode 156 and the sensor electrode 61 is reduced. As a result, rounding of the waveform of the touch driving signal SD is reduced. Therefore, fast touch detection is enabled. Thus, according to the present embodiment, the effect of enabling fast touch detection is obtained in addition to the same effect as that obtained in the above-described first embodiment.

3. Third Embodiment

<3.1 Summary>

A third embodiment will be described. Note that in the following, a process of driving the pixel circuits 110 by the gate driver 13 and the source driver 20 based on control by the display control circuit 30 is referred to as "display driving process", and noise received by the touch panel 12 due to the display driving process is referred to as "display driving noise". In addition, a period during which the display driving process is stopped is referred to as "pause period".

In the above-described first embodiment, both the frame rate for image display and the scan rate for touch detection are 60 Hz. However, the scan rate for touch detection is often set to be higher than the frame rate for image display. For example, there are a case in which the frame rate for image display is 120 Hz, whereas the scan rate for touch detection is 120 Hz, and a case in which the frame rate for image display is 60 Hz, whereas the scan rate for touch detection is 240 Hz.

For the case in which the frame rate for image display is 60 Hz and the scan rate for touch detection is 120 Hz, when the same control as that in the above-described first embodiment is performed, a relationship between the image writing process, the characteristic detection process, and the touch driving process in a given frame period is, for example, the one shown in FIG. 25. In this example, during a period during which the image writing process for one frame is performed, scanning of the touch panel 12 is performed twice. Since the sensor electrodes 61 are divided into four blocks and the touch driving process is performed block by block, as shown in a portion indicated by an arrow given reference character 73 in FIG. 25, eight periods during which the touch driving process is performed are provided during one frame period. In other words, eight pause periods are provided during one frame period.

For the case in which the frame rate for image display is 60 Hz and the scan rate for touch detection is 240 Hz, when the same control as that in the above-described first embodiment is performed, a relationship between the image writing process, the characteristic detection process, and the touch driving process in a given frame period is, for example, the one shown in FIG. 26. In this example, during a period during which the image writing process for one frame is performed, scanning of the touch panel 12 is performed four times. Thus, as shown in a portion indicated by an arrow given reference character 73 in FIG. 26, 16 periods during which the touch driving process is performed are provided during one frame period. In other words, 16 pause periods are provided during one frame period.

As can be grasped from FIGS. 25 and 26, to achieve an increase in the speed of touch detection (i.e., to increase the frequency of touch detection), there is a need to increase the frequency of pause periods. If the frequency of pause periods is increased, then a burden on the display driving process side increases, and for example, a period in each frame period that can be used for the image writing process is shortened, making it difficult to perform high-resolution display.

Hence, in the present embodiment, a configuration is adopted in which when display driving noise is relatively small, the touch driving process is performed during a period during which the image writing process is performed. By thus performing the image writing process and the touch driving process in the same period when display driving noise is relatively small, a sufficient period that can be used for the image writing process is secured, which will be described in detail below.

<3.2 Configuration>

FIG. 27 is a block diagram showing an overall configuration of an active matrix-type organic EL display device according to the present embodiment. In the present embodiment, a noise state signal SN indicating the state of display driving noise is transmitted to the display control circuit 30 from the microcomputer 45 in the touch panel controller 40. Therefore, in addition to the components of the above-described first embodiment (see FIG. 2), there is provided a signal line for transmitting the noise state signal SN to the display control circuit 30 from the touch panel controller 40. In addition, in the microcomputer 45 there is provided a display driving noise extracting unit 451 that extracts display driving noise from detection signals SX received from the touch panel 12.

In the present embodiment, depending on the magnitude of display driving noise extracted by the display driving noise extracting unit 451, different operations are performed. The drive control unit 41 in the touch panel controller 40 controls the operation of the transmitting unit 42 such that timing at which the touch driving process is performed differs between when the magnitude of display driving noise is greater than a predetermined threshold level and when the magnitude of display driving noise is smaller than the predetermined threshold level. The display control circuit 30 controls the operation of the gate driver 13 and the source driver 20 based on the noise state signal SN transmitted from the touch panel controller 40, such that timing at which the image writing process is performed and timing at which the characteristic detection process is performed differ between when the magnitude of display driving noise is greater than the predetermined threshold level and when the magnitude of display driving noise is smaller than the predetermined threshold level.

<3.3 Control Method>

When the magnitude of display driving noise is greater than the predetermined threshold level, the same operation as that in the above-described first embodiment is performed. That is, when the display driving noise is relatively large, the touch driving process is not performed during a period during which the image writing process is performed in any of the pixel rows, but is performed in a block different from a characteristic detection target block during the current measurement period Tb in the characteristic detection period Tdet. In a case in which the frame rate for image display is 60 Hz and the scan rate for touch detection is 240 Hz, as described above, a relationship between the image writing process, the characteristic detection process, and the touch driving process in a given frame period is, for example, the one shown in FIG. 26.

When the magnitude of display driving noise is smaller than the predetermined threshold level, the touch driving process is performed during a period during which the image writing process is performed. In a case in which the frame rate for image display is 60 Hz and the scan rate for touch detection is 240 Hz, a relationship between the image writing process, the characteristic detection process, and the touch driving process in a given frame period is, for example, the one shown in FIG. 28. Note that for a portion indicated by an arrow given reference character 73 in FIG. 28, a period during which the touch driving process is performed (i.e., a period during which a driving signal SD is applied to sensor electrodes 61) is represented as "driving", and a period during which the touch driving process is not performed is represented as "pause".

In the present embodiment, as described above, depending on the magnitude of display driving noise, switching is performed, for example, between a driving state in which each process is performed as shown in FIG. 26 and a driving state in which each process is performed as shown in FIG. 28. More specifically, when the magnitude of display driving noise is greater than the predetermined threshold level, the touch panel controller 40 applies, during the current measurement period Tb in the characteristic detection period Tdet, a touch driving signal SD to sensor electrodes 61 belonging to blocks different from a block corresponding to pixel circuits 110 that are targets for the characteristic detection process, and when the magnitude of display driving noise is smaller than the predetermined threshold level, the touch panel controller 40 performs application of a touch driving signal SD to each sensor electrode 61 during periods other than the current measurement period Tb. Further, the display control circuit 30 controls the operation of the gate driver 13 and the source driver 20 such that the frequency of pause periods is lower when the magnitude of display driving noise is smaller than the predetermined threshold level than when the magnitude of display driving noise is greater than the predetermined threshold level.

Note that in the present embodiment, a display driving noise extracting step is implemented by a process of extracting, by the display driving noise extracting unit 451, display driving noise from detection signals SX, and an amount-of-noise determining step is implemented by a process of determining, by the touch panel controller 40 and the display control circuit 30, whether the magnitude of display driving noise is greater than the predetermined threshold level.

<3.4 Effects>

According to the present embodiment, the touch driving process is performed at timing that differs between when display driving noise (noise received by the touch panel 12 due to a display driving process) is relatively large and when the display driving noise is relatively small. Regarding this, when the display driving noise is relatively large, the touch driving process is performed during a period during which the characteristic detection process is performed as in the above-described first embodiment, whereas when the display driving noise is relatively small, the touch driving process is performed during a period during which the image writing process is performed. That is, when the display driving noise is relatively small, the image writing process and the touch driving process are performed in the same period. Hence, a sufficient period that can be used for the image writing process can be secured. As a result, both high-resolution display and fast touch detection are implemented. Note that the same effect as that obtained in the above-described first embodiment is also obtained.

<3.5 Variant>

In the above-described third embodiment, information indicating the state of display driving noise is sent as a noise state signal SN from the touch panel controller 40 to the display control circuit 30, and the display control circuit 30 allows, based on the noise state signal SN, the gate driver 13 and the source driver 20 to perform operation that differs between when the magnitude of the display driving noise is relatively large and when the magnitude of the display driving noise is relatively small. However, the configuration is not limited thereto, and a configuration shown below (see FIG. 29) can also be adopted.

In the present variant, information indicting the state of display driving noise is sent to the host 50 from the microcomputer 45 in the touch panel controller 40. Then, based on the information, a timing control signal STG that controls timing of a display driving process is sent from the host 50 to the display control circuit 30. Based on the timing control signal STG, the display control circuit 30 allows the gate driver 13 and the source driver 20 to perform operation that differs between when the magnitude of the display driving noise is relatively large and when the magnitude of the display driving noise is relatively small.

4. Others

Although an organic EL display device is described as an example in each of the above-described embodiments (including the variants), the display device is not limited thereto. The content of the present disclosure can be applied to any display device including display elements driven by a current (display elements whose luminance or transmittance is controlled by a current). For example, the content of the present disclosure can also be applied to an inorganic EL display device including inorganic light-emitting diodes, a QLED display device including quantum dot light emitting diodes (QLEDs), etc.

DESCRIPTION OF REFERENCE CHARACTERS

10: ORGANIC EL PANEL
11: DISPLAY UNIT
12: TOUCH PANEL
13: GATE DRIVER
20: SOURCE DRIVER
21: DATA SIGNAL LINE DRIVING UNIT
22: CURRENT MONITORING UNIT
30: DISPLAY CONTROL CIRCUIT
40: TOUCH PANEL CONTROLLER
45: MICROCOMPUTER
50: HOST
61: SENSOR ELECTRODE
80: SWITCHING CIRCUIT
110: PIXEL CIRCUIT
111: ORGANIC EL ELEMENT
156, 156(1) to 156(4): CATHODE ELECTRODE
T2: DRIVE TRANSISTOR

SAG: ACTIVE GUARD SIGNAL
SD: TOUCH DRIVING SIGNAL
BLK(1) to BLK(4): FIRST BLOCK to FOURTH BLOCK

The invention claimed is:
1. A display device including: a display unit including pixel circuits of n rows×m columns (n and m are integers greater than or equal to 2), each having a display element provided between a first electrode and a second electrode and configured to emit light at luminance determined based on a drive current flowing through the second electrode from the first electrode, and a drive transistor configured to control the drive current; and a touch panel including a plurality of sensor electrodes for detecting a touch position on the display unit, the display device comprising:
 a display drive circuit configured to drive the pixel circuits of n rows×m columns while performing a characteristic detection process to compensate for degradation of the drive transistor or the display element, the characteristic detection process including a process of measuring a current flowing through each pixel circuit; and
 a touch panel control circuit configured to apply a touch driving signal for detecting a touch position to the plurality of sensor electrodes and to detect a touch position based on detection signals obtained from the plurality of sensor electrodes,
 wherein the plurality of sensor electrodes are divided into a plurality of blocks such that each block corresponds to pixel circuits in a plurality of consecutive rows and pixel circuits in a plurality of consecutive columns,
 the second electrode is divided so as to correspond to the plurality of blocks, and each of divided second electrodes is shared by a corresponding plurality of display elements, and
 the touch panel control circuit applies the touch driving signal to sensor electrodes belonging to a block different from a block corresponding to pixel circuits that are targets for the characteristic detection process, during a current measurement period during which a process of measuring a current is performed, the process being included in the characteristic detection process.
2. The display device according to claim 1, comprising a switching circuit configured to switch a connection destination of each of the divided second electrodes between a power supply circuit configured to supply a fixed potential for allowing the drive current to flow through the display element and a pseudo driving signal output circuit configured to supply a pseudo driving signal having a same phase and a same potential as the touch driving signal, wherein
 during the current measurement period, the switching circuit connects a divided second electrode corresponding to a block to which sensor electrodes that are targets for application of the touch driving signal belong to the pseudo driving signal output circuit, and connects a divided second electrode corresponding to a block other than the block to which sensor electrodes that are targets for application of the touch driving signal belong to the power supply circuit.
3. The display device according to claim 2, wherein during a period other than the current measurement period, the switching circuit connects all of the divided second electrodes to the power supply circuit.
4. The display device according to claim 1, wherein a block to which the sensor electrodes that is applied the touch driving signal by the touch panel control circuit during the current measurement period belong is a block other than a block adjacent to a block corresponding to pixel circuits that are targets for the characteristic detection process.
5. The display device according to claim 1, wherein
 a number of the plurality of blocks is an even number,
 the characteristic detection process is performed such that a block corresponding to processing-target pixel circuits shifts one block by one block from a block corresponding to pixel circuits in a first row to a block corresponding to pixel circuits in an nth row, and
 application of the touch driving signal to the plurality of sensor electrodes is performed such that a block to which sensor electrodes that are targets for application of the touch driving signal belong shifts one block by one block from a block corresponding to pixel circuits in an nth row to a block corresponding to pixel circuits in a first row.
6. The display device according to claim 1, wherein
 the display unit includes n scanning signal lines, n monitoring control lines, and m data signal lines,
 the display drive circuit includes a scanning-side drive circuit configured to drive the n scanning signal lines and the n monitoring control lines; and a data signal line drive circuit configured to drive the m data signal lines, and
 each pixel circuit includes:
  the display element;
  the drive transistor having a control terminal, a first conductive terminal, and a second conductive terminal;
  a writing control transistor having a control terminal connected to a corresponding scanning signal line, a first conductive terminal connected to a corresponding data signal line, and a second conductive terminal connected to the control terminal of the drive transistor;
  a monitoring control transistor having a control terminal connected to a corresponding monitoring control line, a first conductive terminal connected to the first electrode and the second conductive terminal of the drive transistor, and a second conductive terminal connected to the corresponding data signal line; and
  a capacitive element having one end connected to the control terminal of the drive transistor, and another end connected to the first conductive terminal of the drive transistor.
7. The display device according to claim 1, comprising a display control circuit configured to control operation of the display drive circuit, wherein
 the display control circuit transmits a synchronizing signal to the touch panel control circuit, and
 the touch panel control circuit grasps, based on the synchronizing signal, the current measurement period and a block corresponding to pixel circuits that are targets for the characteristic detection process.
8. The display device according to claim 1, wherein each block corresponds to pixel circuits in m columns.
9. A display device including: a display unit including pixel circuits of n rows×m columns (n and m are integers greater than or equal to 2), each having a display element provided between a first electrode and a second electrode and configured to emit light at luminance determined based on a drive current flowing through the second electrode from the first electrode, and a drive transistor configured to control the drive current; and a touch panel including a plurality of sensor electrodes for detecting a touch position on the display unit, the display device comprising:

a display drive circuit configured to drive the pixel circuits of n rows×m columns while performing a characteristic detection process to compensate for degradation of the drive transistor or the display element, the characteristic detection process including a process of measuring a current flowing through each pixel circuit;

a touch panel control circuit configured to apply a touch driving signal for detecting a touch position to the plurality of sensor electrodes and to detect a touch position based on detection signals obtained from the plurality of sensor electrodes; and a display driving noise extracting unit configured to extract, from the detection signals, display driving noise caused by driving of the pixel circuits of n rows×m columns, wherein the plurality of sensor electrodes are divided into a plurality of blocks such that each block corresponds to pixel circuits in a plurality of consecutive rows and pixel circuits in a plurality of consecutive columns, the second electrode is divided so as to correspond to the plurality of blocks, and each of divided second electrodes is shared by a corresponding plurality of display elements, when magnitude of the display driving noise is greater than a predetermined threshold level, the touch panel control circuit applies the touch driving signal to sensor electrodes belonging to a block different from a block corresponding to pixel circuits that are targets for the characteristic detection process, during a current measurement period during which a process of measuring a current is performed, the process being included in the characteristic detection process, and when the magnitude of the display driving noise is smaller than the predetermined threshold level, the touch panel control circuit applies the touch driving signal to each sensor electrode during a period during which an image writing process for writing a data signal to each pixel circuit is performed, the data signal being based on an image to be displayed on the display unit.

10. The display device according to claim 9, comprising a display control circuit configured to control operation of the display drive circuit such that timing at which the image writing process is performed and timing at which the characteristic detection process is performed differ between when the magnitude of the display driving noise is greater than the predetermined threshold level and when the magnitude of the display driving noise is smaller than the predetermined threshold level.

11. The display device according to claim 10, wherein the display control circuit controls operation of the display drive circuit such that frequency of pause periods during which the image writing process is stopped is lower when the magnitude of the display driving noise is smaller than the predetermined threshold level than when the magnitude of the display driving noise is greater than the predetermined threshold level.

12. A control method for a display device including: a display unit including pixel circuits of n rows×m columns (n and m are integers greater than or equal to 2), each having a display element provided between a first electrode and a second electrode and configured to emit light at luminance determined based on a drive current flowing through the second electrode from the first electrode, and a drive transistor configured to control the drive current; and a touch panel including a plurality of sensor electrodes for detecting a touch position on the display unit, wherein the display device includes:
the display unit;
a display drive circuit configured to drive the pixel circuits of n rows×m columns while performing a characteristic detection process to compensate for degradation of the drive transistor or the display element, the characteristic detection process including a process of measuring a current flowing through each pixel circuit; and
a touch panel control circuit configured to apply a touch driving signal for detecting a touch position to the plurality of sensor electrodes and to detect a touch position based on detection signals obtained from the plurality of sensor electrodes, the plurality of sensor electrodes are divided into a plurality of blocks such that each block corresponds to pixel circuits in a plurality of consecutive rows and pixel circuits in a plurality of consecutive columns, the second electrode is divided so as to correspond to the plurality of blocks, and each of divided second electrodes is shared by a corresponding plurality of display elements, the control method comprises:
an image writing step of allowing the display drive circuit to operate so that a data signal based on an image to be displayed on the display unit is written to each pixel circuit;
a characteristic detecting step of allowing the display drive circuit to operate so that the characteristic detection process is performed; and
a touch position detecting step of allowing the touch panel control circuit to operate so that detection of a touch position is performed, the detection of a touch position in the touch position detecting step is performed during a period during which currents are measured in the characteristic detecting step, and in the touch position detecting step, the touch driving signal is applied to sensor electrodes belonging to a block different from a block corresponding to pixel circuits that are targets for the characteristic detection process.

* * * * *